(12) United States Patent
Ando et al.

(10) Patent No.: US 11,152,214 B2
(45) Date of Patent: Oct. 19, 2021

(54) STRUCTURES AND METHODS FOR EQUIVALENT OXIDE THICKNESS SCALING ON SILICON GERMANIUM CHANNEL OR III-V CHANNEL OF SEMICONDUCTOR DEVICE

(71) Applicant: INTERNATIONAL BUSINESS MACHINES CORPORATION, Armonk, NY (US)

(72) Inventors: Takashi Ando, Tuckahoe, NY (US); John Bruley, Poughkeepsie, NY (US); Eduard A. Cartier, New York, NY (US); Martin M. Frank, Dobbs Ferry, NY (US); Vijay Narayanan, New York, NY (US); John Rozen, Hastings on Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 76 days.

(21) Appl. No.: 15/133,656

(22) Filed: Apr. 20, 2016

(65) Prior Publication Data
US 2017/0309487 A1    Oct. 26, 2017

(51) Int. Cl.
*H01L 21/28*     (2006.01)
*H01L 29/40*     (2006.01)
(Continued)

(52) U.S. Cl.
CPC .. *H01L 21/28255* (2013.01); *H01L 21/28229* (2013.01); *H01L 21/28264* (2013.01);
(Continued)

(58) Field of Classification Search
CPC ......... H01L 21/28255; H01L 21/28264; H01L 29/401; H01L 29/517; H01L 29/785;
(Continued)

(56) References Cited

U.S. PATENT DOCUMENTS 6,974,779 B2 * 12/2005 O'Meara ........... H01L 21/02181
                                                              257/E21.267
7,271,458 B2 *  9/2007 Chui ................. H01L 21/28255
                                                              257/410

(Continued)

OTHER PUBLICATIONS

R. Zhang, N. Taoka, Po-Chin Huang, M. Takenaka and S. Takagi, "1-nm-thick EOT high mobility Ge n- and p-MOSFETs with ultrathin GeOx/Ge MOS interfaces fabricated by plasma post oxidation,";2011 International Electron Devices Meeting, Washington, DC, 2011, pp. 28.3.1-28.3.4. (Year: 2011).*

(Continued)

*Primary Examiner* — Nilufa Rahim
*Assistant Examiner* — Scott E Bauman
(74) *Attorney, Agent, or Firm* — Tutunjian & Bitetto, P.C.; Robert Sullivan

(57) ABSTRACT

A method of forming a semiconductor device that includes forming a metal oxide material on a III-V semiconductor channel region or a germanium containing channel region; and treating the metal oxide material with an oxidation process. The method may further include depositing of a hafnium containing oxide on the metal oxide material after the oxidation process, and forming a gate conductor atop the hafnium containing oxide. The source and drain regions are on present on opposing sides of the gate structure including the metal oxide material, the hafnium containing oxide and the gate conductor.

10 Claims, 17 Drawing Sheets

(51) Int. Cl.
*H01L 29/51* (2006.01)
*H01L 29/66* (2006.01)
*H01L 29/78* (2006.01)
*H01L 29/417* (2006.01)

(52) U.S. Cl.
CPC ...... *H01L 29/401* (2013.01); *H01L 29/41725* (2013.01); *H01L 29/517* (2013.01); *H01L 29/66522* (2013.01); *H01L 29/66545* (2013.01); *H01L 29/785* (2013.01); *H01L 29/66795* (2013.01); *H01L 29/78* (2013.01)

(58) Field of Classification Search
CPC ......... H01L 29/66795; H01L 29/66522; H01L 29/41725; H01L 21/02381; H01L 21/0245; H01L 21/02532; H01L 21/02373; H01L 21/02441; H01L 21/02524

See application file for complete search history.

(56) References Cited

U.S. PATENT DOCUMENTS

| | | | |
|---|---|---|---|
| 7,332,407 | B2 | 2/2008 | Wang et al. |
| 7,442,585 | B2 | 10/2008 | Zhu et al. |
| 8,304,836 | B2 | 11/2012 | Jagannathan et al. |
| 8,334,570 | B2 | 12/2012 | Xu et al. |
| 8,492,852 | B2 | 7/2013 | Chen et al. |
| 9,006,057 | B2 | 4/2015 | Qin et al. |
| 9,059,314 | B2 | 6/2015 | Jagannathan et al. |
| 2003/0227033 | A1 | 12/2003 | Ahn et al. |
| 2004/0067660 | A1* | 4/2004 | Wilk ............... H01L 21/02178 438/779 |
| 2005/0136610 | A1* | 6/2005 | Kitagawa .......... H01J 37/32935 438/402 |
| 2005/0233598 | A1* | 10/2005 | Jung .................... C23C 16/402 438/785 |
| 2006/0040483 | A1* | 2/2006 | Niimi ............... H01L 21/28185 438/591 |
| 2006/0054937 | A1* | 3/2006 | Lucovsky ......... H01L 21/28264 257/213 |
| 2006/0094199 | A1 | 5/2006 | Kil et al. |
| 2008/0261055 | A1 | 10/2008 | Chu et al. |
| 2010/0112798 | A1* | 5/2010 | Lai .................. H01L 21/823842 438/591 |
| 2012/0098107 | A1* | 4/2012 | Raisanen ................. C01B 13/11 257/635 |
| 2013/0292807 | A1* | 11/2013 | Raisanen .............. H01L 29/512 257/635 |
| 2013/0313656 | A1* | 11/2013 | Tong ................. H01L 21/02181 257/411 |
| 2014/0342575 | A1* | 11/2014 | Ito ..................... H01L 21/02172 438/763 |
| 2015/0279937 | A1 | 10/2015 | Jagannathan et al. |
| 2015/0311127 | A1 | 10/2015 | Jagannathan et al. |
| 2015/0311303 | A1 | 10/2015 | Jagannathan et al. |
| 2015/0311308 | A1* | 10/2015 | Siddiqui ............... H01L 29/513 257/637 |
| 2015/0325684 | A1 | 11/2015 | Xu et al. |
| 2016/0042956 | A1* | 2/2016 | Kittl ..................... H01L 29/513 257/194 |
| 2016/0133716 | A1* | 5/2016 | Siddiqui ............... H01L 29/513 257/411 |
| 2016/0358772 | A1* | 12/2016 | Xie ..................... H01L 21/2807 |

OTHER PUBLICATIONS

S. Takagi and M. Takenaka, "Ge/III-V MOS device technologies for low power integrated systems," 2015 45th European Solid State Device Research Conference (ESSDERC), Graz, 2015, pp. 20-25. (Year: 2015).*

Zhang, Ruihan et al. "High mobility Ge pMOSFETs with 0.7 nm ultrathin EOT using HfO2/Al2O3/GeOx/Ge gate stacks fabricated by plasma post oxidation." 2012 Symposium on VLSI Technology (VLSIT);(2012): 161-162. (Year: 2012).*

Zhang, R. et al., "High-Mobility Ge p- and n-MOSFETs With 0.7-nm EOT Using HfO2/Al2O3/GeOx/Ge Gate Stacks Fabricated by Plasma Postoxidation" IEEE Transactions on Electron Devices (Mar. 2013) pp. 927-934, vol. 60, No. 3.

Zhang, R. et al., "High Mobility Ge pMOSFETs with ~ 1nm Thin EOT using Al2O3/GeOx/Ge Gate Stacks Fabricated by Plasma Post Oxidation" 2011 Symposium on VLSI Technology Digest of Technical Papers (2011) pp. 56-57.

Lee, C.H. et al., "Ge/GeO2 Interface Control with High Pressure Oxidation for Improving Electrical Characteristics" ECS Transactions (2009) pp. 165-173, vol. 19, No. 1.

U.S. Office Action issued in U.S. Appl. No. 15/474,482, dated May 2, 2019, pp. 1-24.

U.S. Final Office Action issued in U.S. Appl. No. 15/474,482 dated Feb. 3, 2021, pp. 1-15.

* cited by examiner

STRUCTURES AND METHODS FOR EQUIVALENT OXIDE THICKNESS SCALING ON SILICON GERMANIUM CHANNEL OR III-V CHANNEL OF SEMICONDUCTOR DEVICE

FIELD OF THE INVENTION

The present disclosure relates generally to semiconductor devices, and more particularly to forming gate structures in semiconductor devices.

BACKGROUND

Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Continuing trends in semiconductor device manufacturing include a reduction in electrical device feature size (scaling), as well as improvements in device performance in terms of device switching speed and power consumption.

SUMMARY

In one aspect of the present disclosure, a method of forming a semiconductor device is provided that includes forming a metal oxide material on a III-V channel region. Treating the metal oxide material with an oxidation process. The oxidation process is followed by the deposition of a hafnium containing oxide. A gate conductor is formed atop the hafnium containing oxide, wherein source and drain regions are on opposing sides of the gate structure including the metal oxide material, the hafnium containing oxide and the gate conductor.

In another aspect of the present disclosure, a method of forming a semiconductor device is provided that includes forming an metal oxide material on a germanium containing semiconductor channel region; and treating the metal oxide material with an oxidation process. The method may further include depositing of a hafnium containing oxide on the metal oxide material after the oxidation process, and forming a gate conductor atop the hafnium containing oxide. Source and drain regions are on present on opposing sides of the gate structure including the metal oxide material, the hafnium containing oxide and the gate conductor.

In yet another aspect of the present disclosure, a semiconductor device is provided that may be formed on a germanium containing substrate and employs a process for forming the gate structure of the semiconductor device that includes a oxidation process. The semiconductor device may include a channel region of a substrate including a germanium containing material; and a gate structure including an interface dielectric material comprising germanium, oxygen and nitrogen that is directly on the substrate, a high-k dielectric layer comprising hafnium, aluminum and oxygen is present on the interface dielectric material, and a gate conductor is present atop the high-k dielectric layer. A source region and a drain region are present on opposing sides of the channel region.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
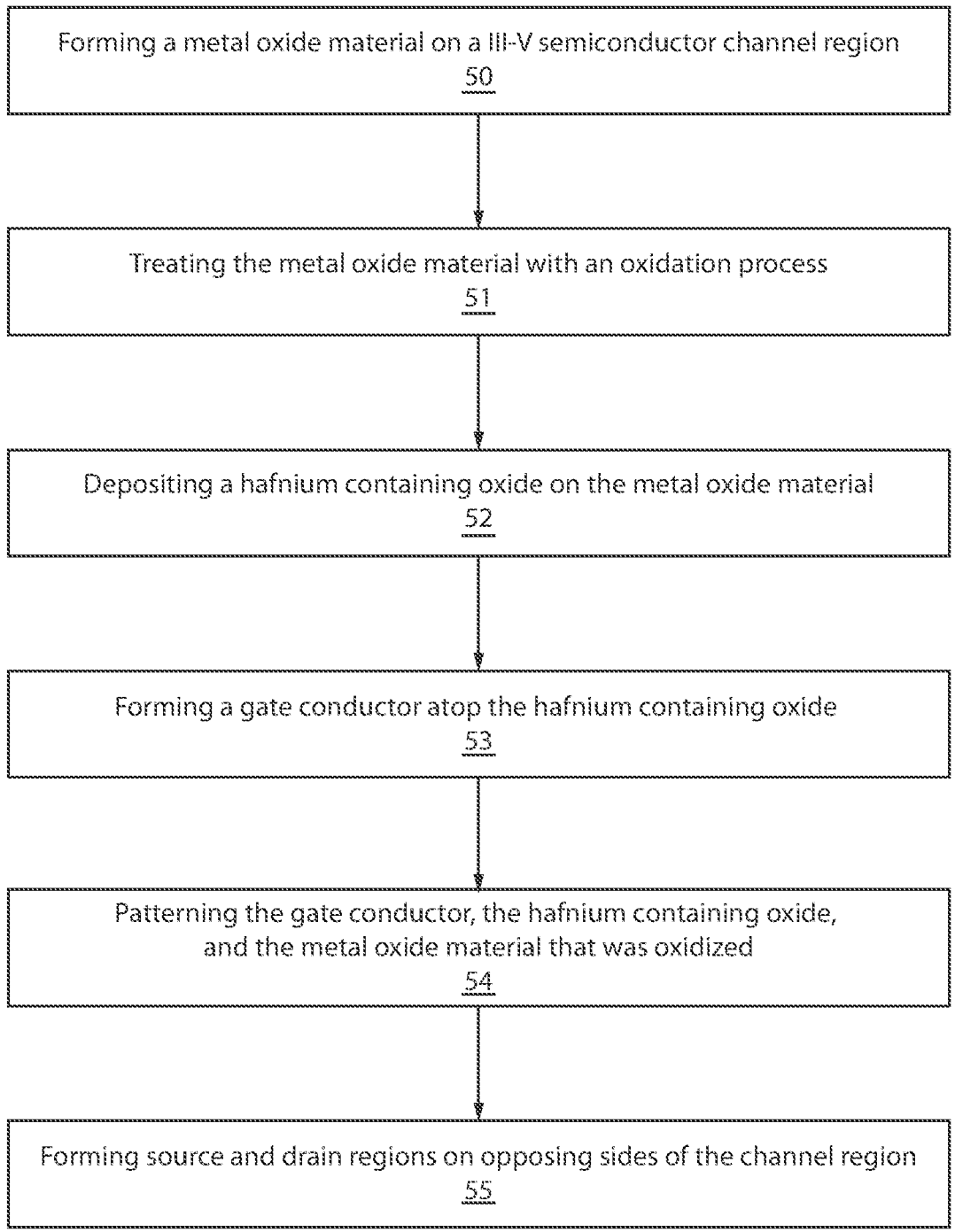
FIG. 1 is a flow chart illustrating one embodiment of a gate first method for forming a semiconductor device on a III-V semiconductor substrate, in accordance with one embodiment of the present disclosure.

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is related to semiconductor devices, such as field effect transistors. A "field effect transistor" is a transistor in which output current, i.e., source-drain current, is controlled by the voltage applied to a gate structure. A field effect transistor typically has three terminals, i.e., a gate structure, source region and drain region. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. A "gate structure" means a structure used to control output current (i.e., flow of carriers in the channel) of a semiconducting device through electrical or magnetic fields. The gate structure typically includes at least one gate dielectric and at least one gate conductor. As used herein, a "gate dielectric" is a layer of an insulator between the semiconductor device substrate of a planar device, or fin structure, and the gate conductor. A "gate conductor" means a conductive structure of the gate structure on the gate dielectric. The field effect transistors (FETs) that are used with the methods and structures provided herein may include planar field effect transistors, planar field effect transistors on bulk substrates, planar field effect transistors on SOI substrates, partially depicted field effect transistors, fully depleted field effect transistors, Fin Field Effect Transistors (FinFETs), nanowire field effect transistors, trigate field effect transistors, horizontal nanowire or nano-sheet semiconductor devices, or vertical nanowire or nanosheets semiconductor devices.

III-V compound semiconductors, such as gallium arsenic (GaAs), indium gallium arsenic (InGaAs), indium arsenic (InAs) and indium antimonide (InSb), are semiconductors considered for use in n-type FET and p-type FET devices for complementary metal oxide semiconductor (CMOS) applications. In some embodiments, the present disclosure provides gate stacks for III-V semiconductor channel field effect transistor (FETs) with a high capacitance and low gate leakage current. It has been determined that the typically employed hafnium oxide ($HfO_2$)/aluminum oxide ($Al_2O_3$)/indium gallium arsenide (InGaAs) gate stack exhibits higher gate leakage than what was previously understood.

In some embodiments, the methods disclosed herein provide an oxidizing treatment that can be performed after the deposition, e.g., first deposition or only deposition, of the material layer for a high-k gate dielectric that has been formed on a III-V semiconductor substrate. It has been determined that the disclosed oxidizing treatment beneficially reduces gate leakage without adversely affecting, i.e., reducing, gate capacitance. As will be described in greater detail below, the preferred oxidizing treatment employs ozone ($O_3$). In one embodiment, in which the gate stack composes hafnium oxide ($HfO_2$)/aluminum oxide ($Al_2O_3$)/ InGaAs, the disclosed process sequence includes the deposition of an aluminum oxide layer ($Al_2O_3$) followed by the oxidizing treatment, e.g., ozone ($O_3$) treatment, wherein the oxidizing treatment is followed by the deposition of hafnium oxide ($HfO_2$). In some embodiments, the oxidizing treatment, e.g., ozone ($O_3$) treatment, dramatically reduce gate leakage while increasing gate capacitance. In some embodiments, the oxidizing treatment increases gate capacitance and decreases gate leakage by modifying, e.g., oxidizing, the III-V substrate surface at the channel region, e.g., oxidizing the InGaAs channel region at the interface with the gate dielectric. For example, an oxide may be formed between the metal oxide layer and the channel portion of the III-V substrate, which is some examples includes gallium oxide ($Ga_xO_y$). The methods and structures of this embodiment are now described with greater detail referring to FIGS. 1-7.

Figure 2:
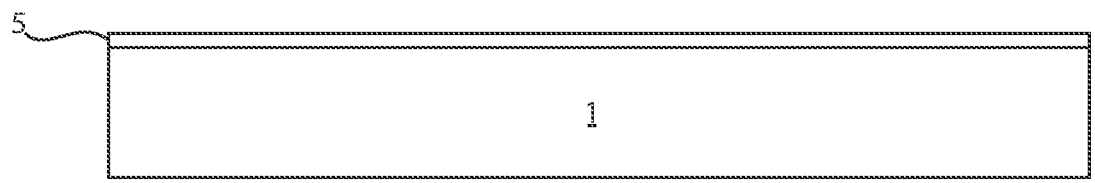
FIG. 2 is a side cross-sectional view depicting one embodiment of forming a metal oxide material on a III-V semiconductor channel region or a germanium containing substrate, in accordance with the present disclosure.

FIG. 1 is a flow chart illustrating one embodiment of a gate first method for forming a semiconductor device on a III-V semiconductor substrate, as depicted in FIGS. 2-7. In some embodiments, the method may begin with forming a metal oxide material 5 on a III-V semiconductor substrate 1 at step 50. Referring to FIG. 2, the III-V semiconductor substrate is composed of a III-V semiconductor material. The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material that provides the III-V semiconductor substrate 1 may be selected from the group of gallium antimonide (GaSb), indium antimonide (InSb), indium gallium antimonide (InGaSb), aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. In one example, the III-V substrate 1 may be composed of aluminum gallium arsenide (AlGaAs) in a bulk semiconductor substrate configuration. Although FIGS. 2-7 depict a planar semiconductor device formed on a bulk substrate, the present disclosure is not limited to only this example. For example, the III-V semiconductor substrate 1 may be a semiconductor on insulator (SOI) substrate, e.g., silicon on insulator substrate, extremely thin semiconductor on insulator (ETSOI) substrate, or the semiconductor substrate 1 may be fin type structures, such as a fin type structure employed in Fin Field Effect Transistors (FinFETs).

FIG. 2 depicts one embodiment of forming a metal oxide material 5 on a III-V semiconductor channel region, e.g., as provided by a III-V semiconductor substrate 1, or a germanium containing substrate. In the embodiment, the metal oxide material 5 may be composed of aluminum oxide ($Al_2O_3$). It is noted that aluminum oxide ($Al_2O_3$) is only one example of a metal oxide material 5 that can be used at this step of the present disclosure, and it is not intended that the metal oxide material 5 be limited to only this example. For example, the metal oxide material 5 may also be composed of zirconium oxide ($ZrO_2$), lanthanum oxide ($La_2O_3$) or combinations thereof including combinations with aluminum oxide ($Al_2O_3$). The metal oxide material 5 may be deposited using atomic layer deposition (ALD) or chemical vapor deposition (CVD). "Atomic layer deposition" (ALD) as used herein refers to a vapor deposition process in which numerous consecutive deposition cycles are conducted in a deposition chamber. Typically, during each cycle a metal precursor is chemisorbed to the substrate surface, i.e., surface of the low-k dielectric material; excess precursor is purged out; a subsequent precursor and/or reaction gas is introduced to react with the chemisorbed layer; and excess reaction gas (if used) and by-products are removed.

Chemical vapor deposition (CVD) is a deposition process in which a deposited species is formed as a result of chemical reaction between at least two gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

The thickness of the metal oxide material 5 may range from 1 Å to 10 Å. In some embodiments, the thickness of the metal oxide material 5 may range from 2 Å to 5 Å.

Figure 3:
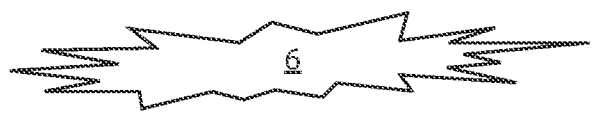
FIG. 3 is a side cross-sectional view depicting treating the metal oxide material with an oxidation process, in accordance with one embodiment of the present disclosure.
Figure 3:
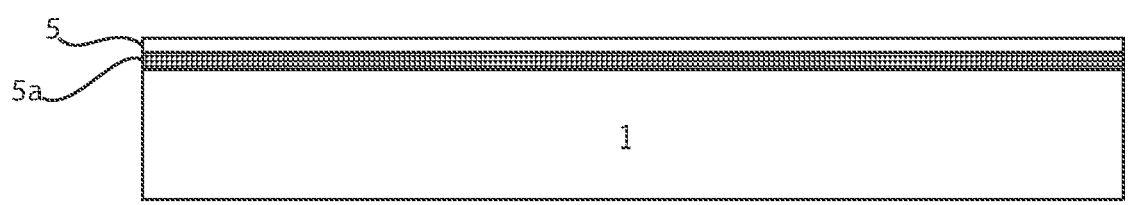

Following formation of the metal oxide material, the method may continue to step 52 of FIG. 1, which includes treating the metal oxide with an oxidation process 6, as depicted in FIG. 3. The term "oxidation process" denotes a process that introduces at least one oxygen containing element or species that reacts with at least one element of a material to which the oxidation process is being applied, which results in the formation of an oxide. In some embodiments, treating of the metal oxide material with the oxidation process includes an ozone containing gas, and is conducted in a same deposition chamber that deposits said metal oxide layer without an air break. For example, if the metal oxide material 5 is deposited using an atomic layer deposition (ALD) apparatus, following the deposition of the metal oxide material 5, the atomic layer deposition chamber is pumped down to remove any precursor gas that was used to deposit the metal oxide material, the temperature of the deposition chamber is adjusted for the oxidation process, and the precursors for the oxidation process are pumped into the deposition chamber including the substrate including the metal oxide material 5 without an air break between those steps. By "without an air break" it is meant that there is no disruption of the deposition chamber vacuum and/or atmosphere that would introduce air, i.e., the ambient atmosphere the deposition chamber, into the deposition chamber at which the oxidation process is being performed.

In some embodiments, the gas precursors for the oxidation process 6 may include ozone ($O_3$) gas, $H_2O$ gas, NO, $N_2O$, atomic oxygen gas or a combination thereof. Although the gas precursors are typically introduced to the metal oxide material 5 following its deposition without air break, in some examples, the use of an air break has been contemplated for using atmospheric air as the gas for providing the oxidation process 6. In other embodiments, the oxidation process 6 may include a plasma. In some embodiments, the plasma that is employed for the oxidation process may include at least one of $O_2$, $H_2O$, NO, $N_2O$ and combinations thereof.

In one embodiment, the oxidation process comprises a oxidation treatment temperature ranging from approximately 20° C. to 500° C. The oxidation process, i.e., application of the gas precursor and/or plasma, and the application of the oxidation treatment temperature may be maintained while the metal oxide material 5 is present within the deposition chamber for a time period ranging from 1 second to 10 minutes. In one embodiment, a different oxygen containing precursor is used in the oxidation process than the precursor used in the deposition process for depositing the metal oxide material, wherein an exposure precursor time during the oxidation process is greater than an exposure precursor time during forming the metal oxide material.

In some embodiments, the oxidation process 6 forms an oxide region 5a composed of an element from the III-V substrate 1, e.g., gallium (Ga) from a III-V substrate 1 composed of InGaAs, that extends from the lower surface of the metal oxide material 5, e.g., a metal oxide material 5 provided by an $Al_2O_3$ layer. The concentration of the element from the III-V substrate that is present in the oxide region 5a may have a higher concentration in the portion of the oxide region 5a that is abutting, i.e., in direct contact with, the metal oxide material 5, e.g., $Al_2O_3$ layer, and the concentration of the element from the III-V substrate, e.g., Gallium (Ga) that is present in the oxide region 5a decreases as extending away from the interface with the metal oxide material, e.g., $Al_2O_3$ layer, into the substrate 1. The overall thickness of the oxide region 5a may range from 1 Å to 10 Å. In some embodiments, the overall thickness of the oxide region 5a may range from 2 Å to 5 Å. It is noted that there may be some hafnium from the later formed hafnium containing dielectric 15 that diffuses to and alloys with the oxide region 5a, as well as metal from the metal oxide material 5 that diffuses to and alloys with the oxide region 5a.

The oxidizing treatment 6, e.g., ozone ($O_3$) treatment, dramatically reduces gate leakage while increasing gate capacitance in the final device structure including a gate stack of the metal oxide material 5 and the oxide region 5a.

Figure 4:
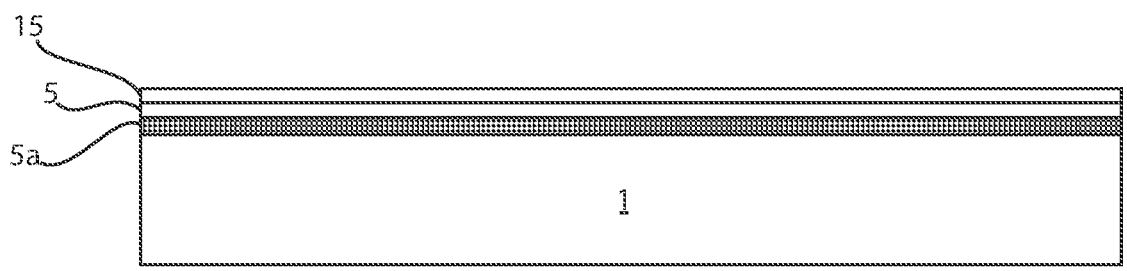
FIG. 4 is a side cross-sectional view depicting depositing of a hafnium containing oxide on the metal oxide material after the oxidation process, in accordance with one embodiment of the present disclosure.
Figure 5:
FIG. 5 is a side cross-sectional view depicting one embodiment of forming a material layer for a gate conductor on the hafnium containing oxide, in accordance with the present disclosure.

Following the application of the oxidation process 6, the method may continue to step 53 of FIG. 1, which includes depositing of a hafnium containing oxide 15 on the metal oxide material 5 after the oxidation process, as depicted in FIG. 4. One example of a hafnium containing oxide 15 that is suitable for use with the present disclosure is hafnium oxide ($HfO_2$). It is noted that hafnium oxide ($HfO_2$) is not the only material that is suitable for the hafnium containing oxide 15. Examples of such Hf-based dielectrics that are suitable for the hafnium containing oxide may include hafnium oxide ($HfO_2$), hafnium silicate ($HfSiO_x$), Hf silicon oxynitride (HfSiON) or multilayers thereof. In some other examples, the hafnium containing oxide 15 may be substituted with another high-k composition. The term "high-k" denotes a dielectric material having a dielectric constant greater than silicon oxide ($SiO_2$) at room temperature (20° C. to 25° C.) and atmospheric pressure (1 atm). For example, a high-k material may have a dielectric constant greater than 4.0. In another example, the high-k material has a dielectric constant greater than 7.0. Examples of high-k dielectrics that do not include hafnium are $ZrO_2$ or rare earth oxides, such as $La_2O_3$. MgO or MgNO can also be used. The at least one hafnium containing oxide 15 may have a thickness ranging from about 1.0 Å to about 50.0 Å. It is noted that there may be some hafnium from the hafnium containing dielectric 15 that diffuses to and alloys with the oxide region 5a.

Referring to FIG. 1, the method may continue at step 53 with forming a gate conductor 20 atop the hafnium containing oxide 15. The gate conductor 20 may include a doped semiconductor, e.g., n-type doped polysilicon, a metal or a metal nitride, and may be a single layer structure or a multi-layer structure. For example, in some embodiment, composed of a metal nitride, such as titanium nitride (TiN). In some examples, the gate conductor 20 may include an electrically conductive material layer in which work function adjustments are provided by a work function adjustable layer. For example, when the gate conductor 20 includes TiN, stoichiometric tuning can be accomplished by adjusting the titanium (Ti) to nitrogen (N) ratio during the physical vapor deposition (PVD) sputtering program for forming the material layer of the gate conductor 20. Although titanium nitride (TiN) is described above as an embodiment of a material suitable for the gate conductor with a work function adjustment, other metal nitrides may be suitable for use with the present disclosure. For example, the metal layers for work function adjustments may further comprise aluminum. In other examples, metal work function adjusting layers may include other metals from Groups IVB to VIB in the Periodic Table, including, e.g., tantalum nitride (TaN), niobium nitride (NbN), vanadium nitride (VN), tungsten nitride (WN), and the like with a thickness of about 20 Angstroms to about 30 Angstroms.

The conductive electrode i.e., gate conductor 20, may be composed of any metal containing material. For example, the gate conductor 20 may be composed of tungsten (W) or a tungsten including alloy. In other examples, the gate conductor 20 is composed of aluminum (Al), copper (Cu), platinum (Pt), silver (Ag) or an alloy thereof including alloys with tungsten (W).

The gate conductor 20 may be deposited using physical vapor deposition (PVD), such as plating, electroplating, electroless plating, sputtering and combinations thereof. In other embodiments, the gate conductor 20 may be deposited using chemical vapor deposition (CVD), such as plasma enhanced chemical vapor deposition (PECVD).

Figure 6:
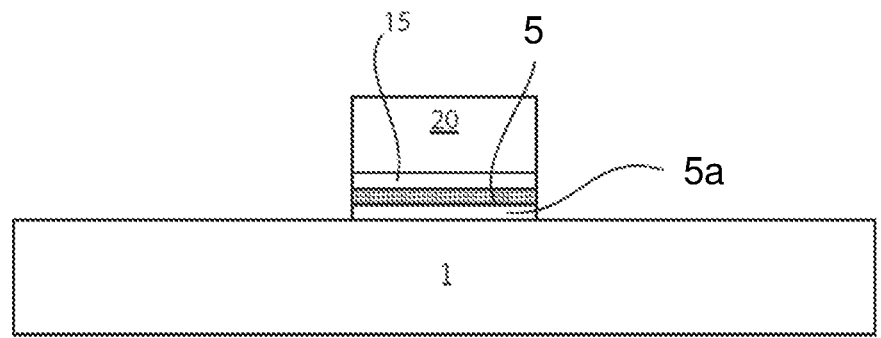
FIG. 6 is side cross-sectional view depicting one embodiment of patterning a gate structure.

Referring to FIG. 1, the method may progress to step 54, which includes patterning the gate conductor 20, the hafnium containing oxide 15, and the metal oxide material 5. FIG. 6 depicts one embodiment of patterning a gate structure 60. The patterned gate structures 60 are formed utilizing photolithography and etch process steps. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. The etch process for patterning the gate structure 60 may include an anisotropic etch, such as reactive ion etching (RIE).

Referring to FIG. 6, the method may continue with forming a gate sidewall spacer 21 on each of the gate structure 50. The gate sidewall spacer 21 may be composed of oxide, i.e., SiO$_2$, but may also comprise nitride or oxynitride materials. The gate sidewall spacer 21 can be formed by deposition and etch processes.

Figure 7:
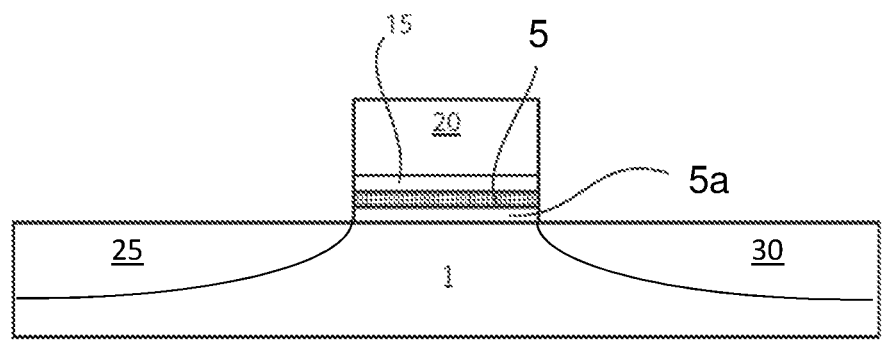
FIG. 7 is a side cross-sectional view depicting forming source regions and drain regions on opposing sides of the channel region, in accordance with one embodiment of the present disclosure.

Following formation of the gate sidewall spacer 21, source regions 25 and drain regions 30 are formed on opposing sides of the channel region, as depicted in FIG. 7. The source regions 25 and drain regions 30 may be formed using ion implantation, in which an n-type or p-type dopant is implanted into the III-V semiconductor substrate 1. In some embodiments, a n-type dopant in a type III-V semiconductor material, such as InGaAs, can be element from Group IIA or VIA of the Periodic Table of Elements). As used herein, "n-type" refers to the addition of impurities that contributes free electrons to an intrinsic semiconductor. As used herein, "p-type" refers to the addition of impurities to an intrinsic semiconductor that creates deficiencies of valence electrons.

Although not depicted in the supplied figures the source and drain regions 25, 30 may further include raised source and drain regions. Raised source and drain regions may include in-situ doped epitaxially formed semiconductor material that is formed on the upper surface of the substrate 1 in which the source and drain regions 25, 30 are present.

Figure 8:
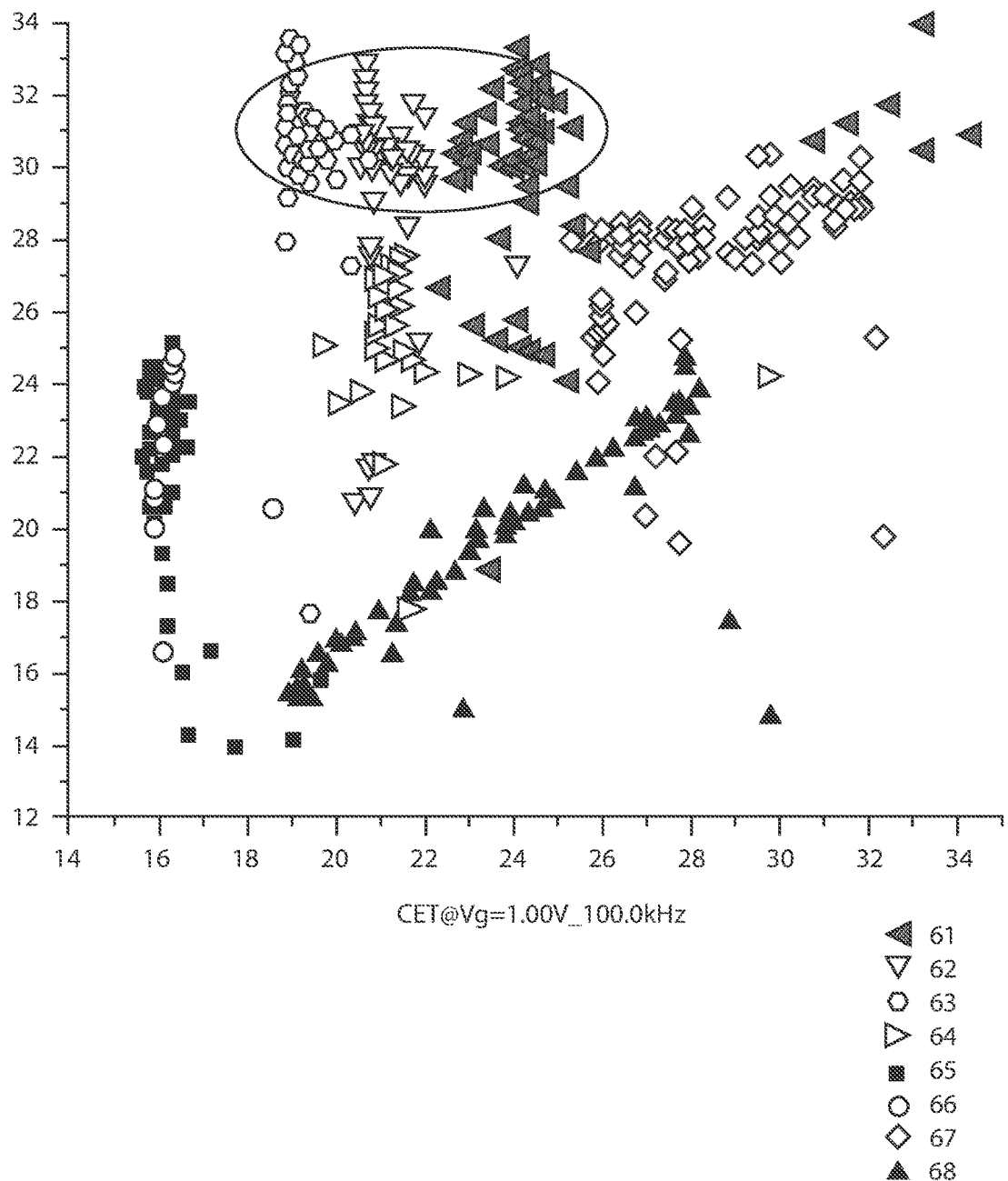
FIG. 8 is a plot of gate leakage for gate structures formed using one embodiment of the method described with reference to FIGS. 1-7 in comparison to comparative examples that do not include an oxidation process as described in the present disclosure.

FIG. 8 illustrates a comparison of the gate leakage performance of field effect transistors (FETs) having gate structures formed using the above described oxidation process, e.g., step 51 of the method that has been described above with reference to FIG. 1, in comparison to the gate leakage performance of FETs that have not been treated with the oxidation process of the present disclosure. Plot 61 illustrates the gate leakage measured from a gate structure including a TiN gate conductor, a 35 Å thick hafnium oxide (HfO$_2$) layer, and a 5 Å thick aluminum oxide (AlO) layer that has been treated with a oxidation process, as described with reference to step 51 of the method sequence depicted in FIG. 1. Plot 62 illustrates the gate leakage measured from a gate structure including a TiN gate conductor, a 30 Å thick hafnium oxide (HfO$_2$) layer, and a 5 Å thick aluminum oxide (AlO) layer that has been treated with a oxidation process, as described with reference to step 51 of the method sequence depicted in FIG. 1. Plot 63 illustrates the gate leakage measured from a gate structure including a TiN gate conductor, a 30 Å thick hafnium oxide (HfO$_2$) layer, and a 10 Å thick aluminum oxide (AlO) layer that has been treated with a oxidation process, as described with reference to step 51 of the method sequence depicted in FIG. 1.

Plot 64 illustrates the gate leakage measured from a gate structure including a TiN gate conductor, a 30 Å thick hafnium oxide (HfO$_2$) layer, and a 10 Å thick aluminum oxide (AlO) layer that has not been treated with an oxidation process, as described with reference to step 51 of the method sequence depicted in FIG. 1. Plot 65 illustrates the gate leakage measured from a gate structure including a TiN gate conductor, and a 35 Å thick hafnium oxide (HfO$_2$) layer that has not been treated with a oxidation process, as described with reference to step 51 of the method sequence depicted in FIG. 1. Plot 66 illustrates the gate leakage measured from a gate structure including a TiN gate conductor, a 25 Å thick hafnium oxide (HfO$_2$) layer that has not been treated with a oxidation process and a 3 Å aluminum oxide layer, in which a oxide layer is between the hafnium oxide (HfO$_2$) and the aluminum oxide layer, wherein the gate structure has not been treated with an oxidation process, as described with reference to step 51 of the method sequence depicted in FIG. 1. Plot 67 illustrates the gate leakage measured from a gate structure including a TiN gate conductor, a 35 Å thick hafnium oxide (HfO$_2$) layer that has not been treated with a oxidation process and a 5 Å aluminum oxide (Al$_2$O$_3$) layer, wherein the gate structure has not been treated with an oxidation process, as described with reference to step 51 of the method sequence depicted in FIG. 1. Plot 68 illustrates the gate leakage measured from a gate structure including a TiN gate conductor, a 30 Å thick hafnium oxide (HfO$_2$) layer that has not been treated with a oxidation process and a 5 Å aluminum oxide (Al$_2$O$_3$) layer, wherein the gate structure has not been treated with an oxidation process, as described with reference to step 51 of the method sequence depicted in FIG. 1.

Comparison of the gate structures that have been treated with the oxidation process, as described with reference to FIGS. 1-7, i.e., including step 51, to the gate structures that were identically formed with the exception of not including the oxidation process of the present disclosure reveals that the disclosed oxidation process provides reduced gate leakage.

Figure 9:
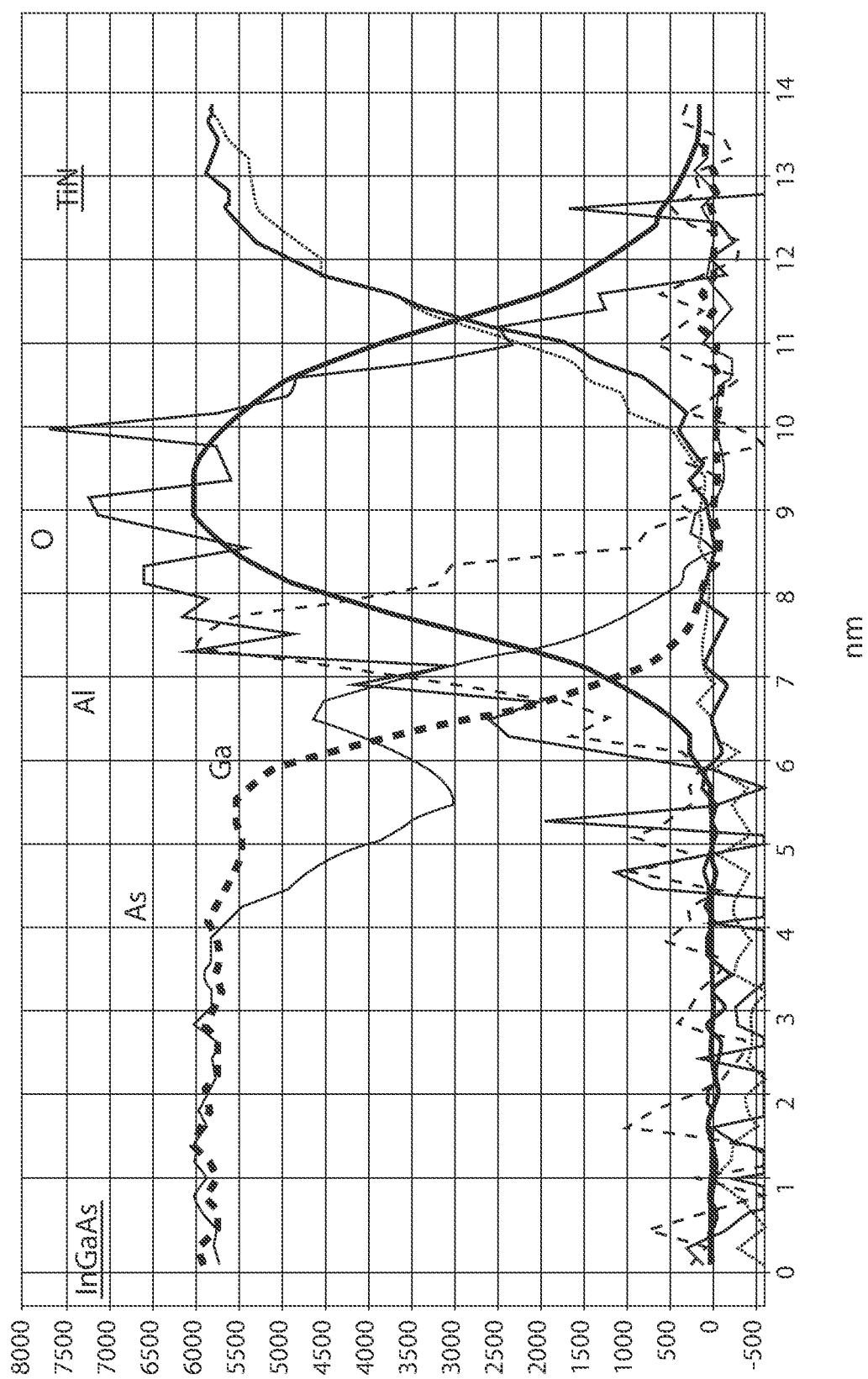
FIG. 9 is an electron energy loss spectroscopy (EELS) plot of the composition of an oxide region that is formed using the method described with reference to FIGS. 1-7.

FIG. 9 is a plot of electron energy loss spectroscopy (EELS) of an oxide region 5a formed in accordance with the method described above with reference to FIGS. 1-8, in which an aluminum oxide (Al$_2$O$_3$) metal oxide layer 5 is formed on an indium gallium arsenide (InGaAs) substrate 1 and treated with the above described oxidation process 6 to form the oxide region 5a. The EELS plots illustrate that the method depicted in FIGS. 1-7 form an oxide region 5a composed of gallium (Ga) extending from the lower surface of the metal oxide layer 5, e.g., Al$_2$O$_3$ layer, having a higher gallium concentration abutting the Al$_2$O$_3$ layer and a lower gallium (Ga) concentration extending away from the interface with the Al$_2$O$_3$ layer into the substrate. In some embodiments, the Ga/As and Ga/In ratios are higher at the Al$_2$O$_3$ interface than in the bulk substrate In0.53Ga0.47As, and lower in a thin area away from that interface. In some embodiments, there can be some intermixing occurring in the oxide region 5a with the metal oxide layer 5 and the overlying hafnium containing layer 15.

Figure 10:
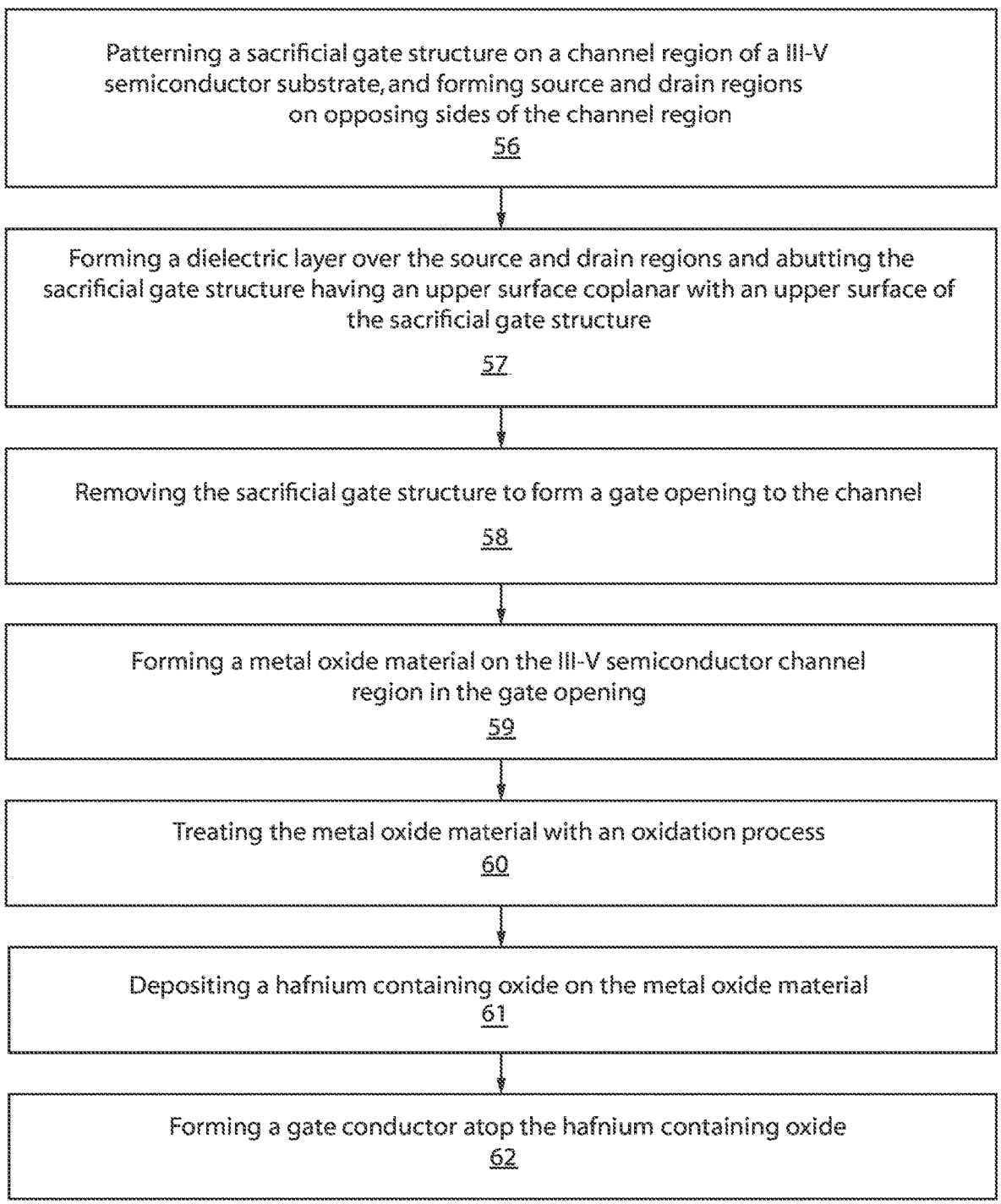
FIG. 10 is a flow chart illustrating one embodiment of a gate last method for forming a semiconductor device on a III-V semiconductor substrate, in accordance with one embodiment of the present disclosure.

The method depicted in FIGS. 1-7 is a gate first process. The method described with reference to FIGS. 1-9 is equally applicable to a gate last process that employs a sacrificial gate structure prior to forming the source and drain regions, and then replaces the sacrificial gate structure with a functional gate structure after forming the source and drain regions. FIG. 10 is a flow chart illustrating one embodiment of a gate last method for forming a semiconductor device on a III-V semiconductor substrate 1.

Figure 11:
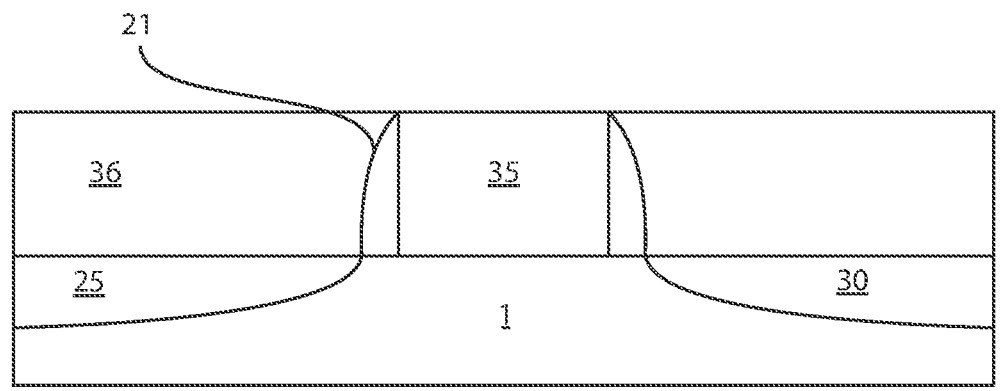
FIG. 11 is a side cross-sectional view depicting forming a sacrificial gate structure on a III-V semiconductor substrate or germanium containing substrate, forming source and drain regions on opposing sides of a channel region of a semiconductor device, and forming a dielectric layer having an upper surface that is coplanar with the sacrificial gate structure.

Referring to FIGS. 10 and 11, the method may begin with forming a sacrificial gate structure 35 on a III-V semiconductor substrate 1, and forming source and drain regions 25, 30 on opposing sides of a channel region of a semiconductor device, at step 56. The II-V semiconductor substrate 1 that is depicted in FIG. 11 has been described above with reference to FIG. 2. For example, the III-V semiconductor substrate 1 may be composed of InGaAs. In some embodiments, the sacrificial gate structures 35 that are depicted in FIG. 10 are formed of a semiconductor material, such as polysilicon. But, in other embodiments, the sacrificial gate structures 35 may be composed of a dielectric material. The replacement gate structures 60 may be formed using deposition, photolithography and etching processes. The sacrificial gate structures 35 are formed to have a geometry that matches the geometry of the later formed functional gate structures.

Sidewall spacer 21 are formed on sidewalls of the sacrificial gate structure 35 similar to the sidewall spacer 21 that has been described above with reference to FIG. 7. The above description of the sidewall spacers 21 that are depicted in FIG. 7 is suitable for the description of the sidewall spacer that is depicted in FIG. 11.

The source and drain regions 25, 30 may be formed using ion implantation. Some examples of the processing and the composition of the source and drain regions 25, 30 that are depicted in FIG. 11 is provided above with reference to the source and drain regions 25, 30 that are depicted in FIG. 7. For example, the source and drain regions 25, 30 depicted in FIG. 11 may be formed using ion implantation of n-type or p-type dopants.

Referring to FIGS. 10 and 11, following formation of the source and drain regions 25, 30, a dielectric layer 36 may be formed having an upper surface that is coplanar with the sacrificial gate structure 35 at step 57. The dielectric layer 36 may be deposited using chemical solution deposition, spin on deposition, chemical vapor deposition or a combination thereof. The dielectric layer 36 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. Following deposition, the dielectric layer 36 may be planarized to provide an upper surface that is coplanar with an exposed upper surface of the sacrificial gate structures 35. In one example, the planarization process is chemical mechanical planarization (CMP).

Figure 12:
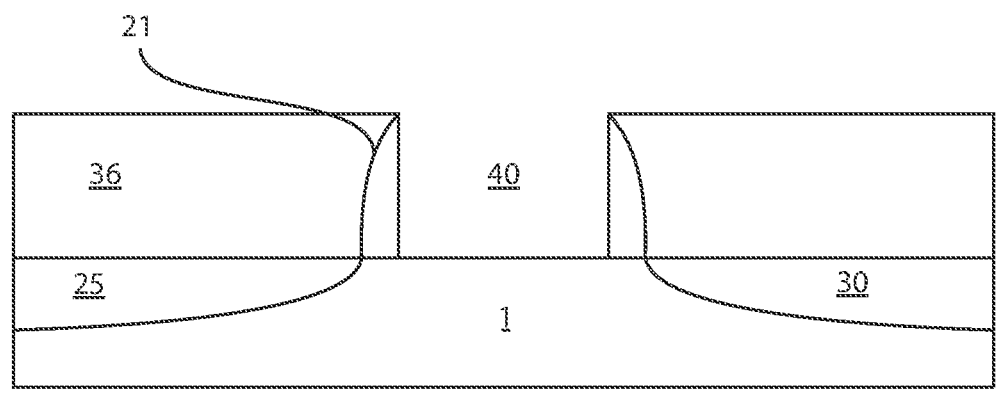
FIG. 12 is a side cross-sectional view depicting removing the sacrificial gate structure to provide a gate opening to the channel region of the semiconductor device, in accordance with one embodiment of the present disclosure.

Referring to FIGS. 10 and 12, at step 58, the method may continue with removing the sacrificial gate structure 35 to provide a gate opening 40 to the channel region of the semiconductor device. The sacrificial gate structures 35 may be removed using a selective etch process.

Figure 13:
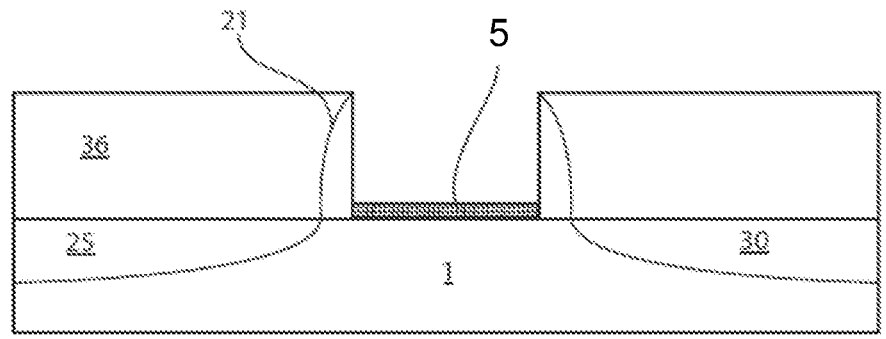
FIG. 13 is a side cross-sectional view depicting one embodiment of forming a metal oxide material on a III-V semiconductor channel region or a germanium containing substrate, in accordance with the present disclosure.

Referring to FIG. 10, the method may continue with forming a metal oxide material on the channel region of the III-V semiconductor substrate 1 at step 59. FIG. 13 depicts one embodiment of forming a metal oxide material 5 on a III-V semiconductor channel region of the III-V semiconductor substrate 1. The metal oxide material 5 is formed within the gate opening 40, and is present on at least a base surface of the gate opening 40 that is provided by the upper surface of the channel portion of the III-V semiconductor substrate 1. In some embodiments, portions of the metal oxide material 5 may also be present on the sidewalls of the gate opening 40 provided by the gate sidewall spacers 21. The metal oxide material 5 that is depicted in FIG. 13 is similar to the metal oxide material 5 that is described above with reference to FIG. 2. Therefore, the above description of the metal oxide material 5 that is depicted in FIG. 2 is suitable for the metal oxide material that is depicted in FIG. 13. For example, the metal oxide material may be composed of aluminum oxide ($Al_2O_3$).

Figure 14:
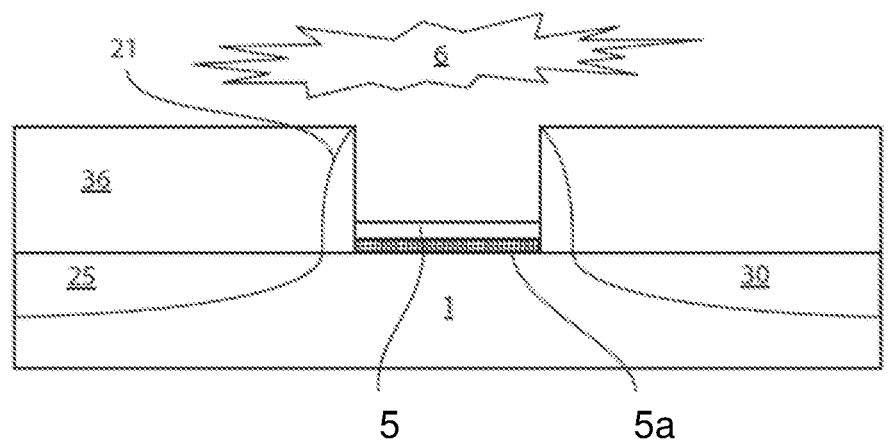
FIG. 14 is a side cross-sectional view depicting treating the metal oxide material with an oxidation process, in accordance with one embodiment of the present disclosure.

Referring to FIG. 10, in a following process step, i.e., at step 60, the method can include treating the metal oxide material 5 with an oxidation process 6. As depicted in FIG. 14, the oxidation process 6 is applied in a gate last process flow after the source and drain regions 25, 30 have been formed. The oxidation process 6 that is depicted in FIG. 14 is similar to the oxidation process 6 that is described above with reference to FIG. 3. For example, the oxidation process 6 employed in the process flow described with reference to FIGS. 10-16 may include ozone and forms an oxide region 5a in the III-V substrate underlying the metal oxide layer 5. Therefore, the above description of the oxidation process 6 that is depicted in FIG. 3 is suitable for the oxidation process 6 that is depicted in FIG. 14. Additionally, the above description of the oxide region 5a that is depicted in FIG. 3 is suitable for the oxide region 5a that is depicted in FIG. 14.

For example, the oxide region 5a depicted in FIG. 14 may be composed of an element from the III-V substrate 1, e.g., gallium (Ga) from a III-V substrate 1 composed of InGaAs, that extends from the lower surface of the metal oxide material 5, e.g., a metal oxide material 5 provided by an $Al_2O_3$ layer. The concentration of the element from the III-V substrate that is present in the oxide region 5a may have a higher concentration in the portion of the oxide region 5a that is abutting, i.e., in direct contact with, the metal oxide material 5, e.g., $Al_2O_3$ layer, and the concentration of the element from the III-V substrate, e.g., Gallium (Ga) that is present in the oxide region 5a decreases as extending away from the interface with the metal oxide material, e.g., $Al_2O_3$ layer, into the substrate 1. It is noted that there may be some hafnium from the later formed hafnium containing dielectric 15 that diffuses to and alloys with the oxide region 5a, as well as metal from the metal oxide material 5 that diffuses to and alloys with the oxide region 5a. The oxidizing treatment 6, e.g., ozone ($O_3$) treatment, depicted in FIG. 14 can dramatically reduce gate leakage while increasing gate capacitance in the final device structure including a gate stack of the metal oxide material 5 and the oxide region 5a, as formed using the method described in FIGS. 10-16.

Figure 15:
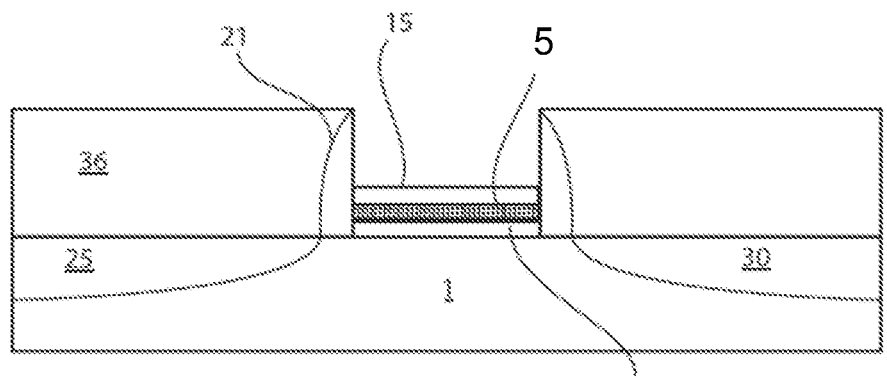
FIG. 15 is a side cross-sectional view depicting depositing of a hafnium containing oxide on the metal oxide material after the oxidation process, in accordance with one embodiment of the present disclosure.

FIG. 15 depicts one embodiment of depositing of a hafnium containing oxide 15 on the metal oxide material 5 after the oxidation process 6 at step 61 of the process flow depicted in FIG. 10. The hafnium containing oxide 15 that is depicted in FIG. 15 is similar to the hafnium containing oxide 15 that is described above with reference to FIG. 3. Therefore, the above description of the hafnium containing oxide 15 that is depicted in FIG. 3 is suitable for the hafnium containing oxide 15 that is depicted in FIG. 15. For example, the hafnium containing oxide 15 may be composed of hafnium oxide ($HfO_2$). In some embodiments, the hafnium containing oxide material 15 is formed within the gate opening 40, and is present on the metal oxide material 5 on at least a base surface of the gate opening 40 that is provided by the upper surface of the channel portion of the III-V semiconductor substrate 1. The hafnium containing oxide material may also be present on the sidewalls of the gate opening 40, i.e., be formed on the portions of the metal oxide material 5 that are present on the sidewalls of the gate opening 40.

Figure 16:
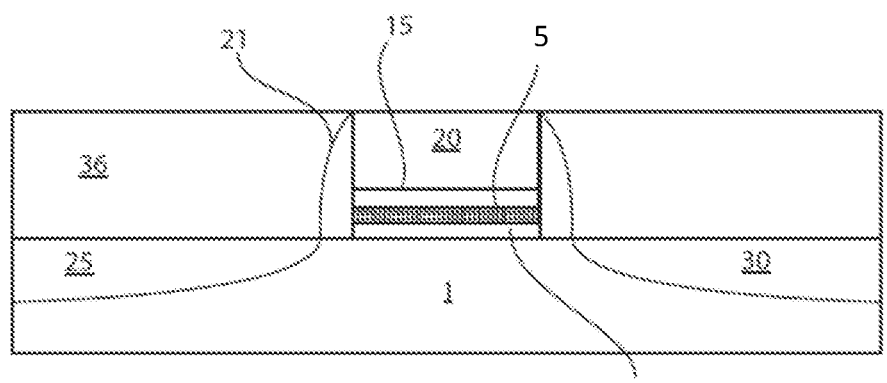
FIG. 16 is a side cross-sectional view depicting one embodiment of forming a material layer for a gate conductor on the hafnium containing oxide, in accordance with the present disclosure.

Referring to FIG. 10, in one embodiment, the method may continue with step 62 with forming a gate conductor 20 on the hafnium containing oxide 15. FIG. 16 depicts one embodiment of forming gate conductor 20 on the hafnium containing oxide 5. In some embodiments the gate conductor 20 may fill the gate opening 40. For example, the gate conductor 20 may be overfilled, and then planarized, e.g., by chemical mechanical planarization (CMP), to provide that an upper surface of the gate conductor is coplanar with an upper surface of the dielectric layer 36. The gate conductor 20 that is depicted in FIG. 16 is similar to the gate conductor 20 that is described above with reference to FIG. 6. Therefore, the above description of the gate conductor 20 that is depicted in FIG. 6 is suitable for the gate conductor 20 that is depicted in FIG. 16.

Figure 17:
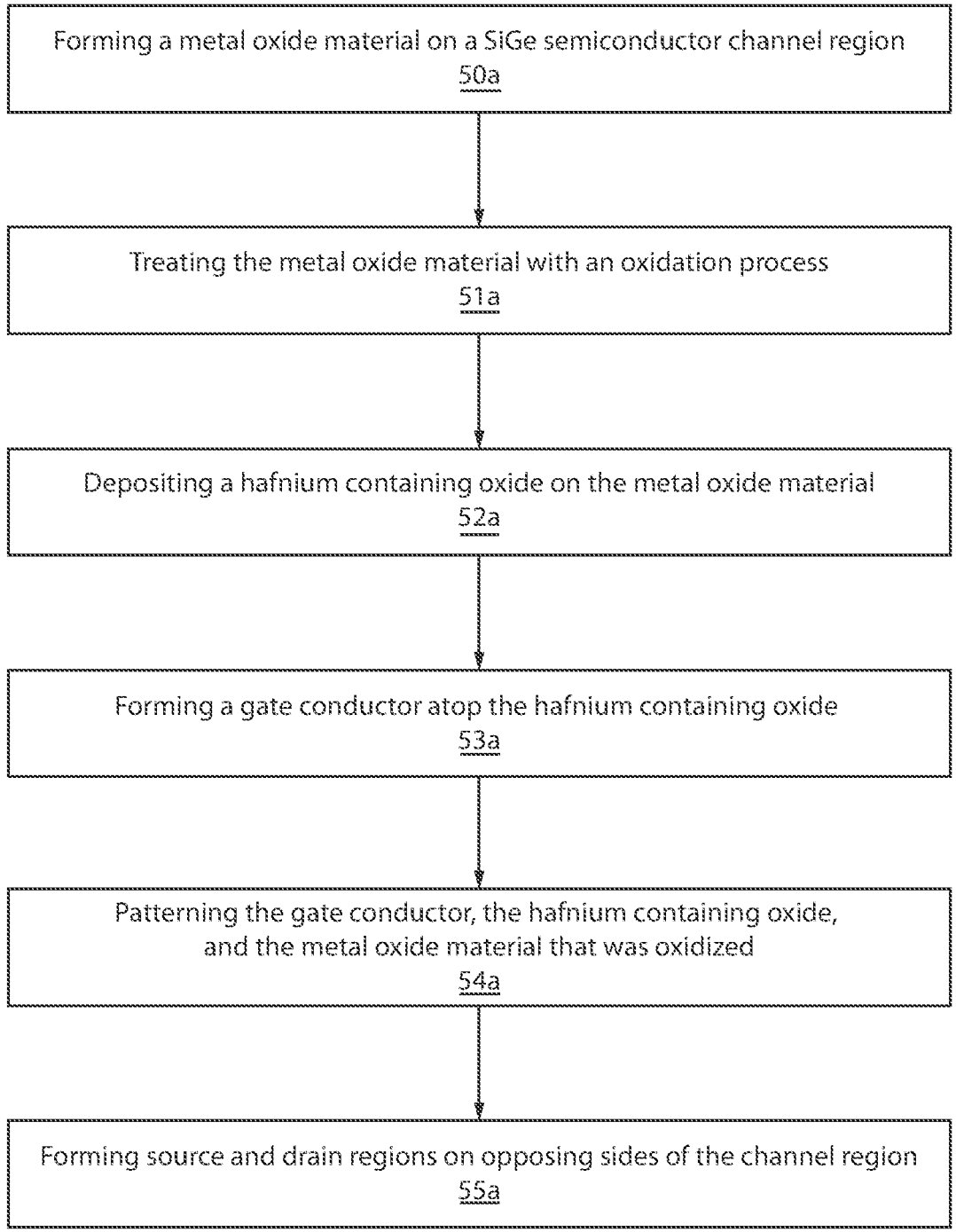
FIG. 17 is a flow chart illustrating one embodiment of a gate first method for forming a semiconductor device on a germanium containing substrate, in accordance with one embodiment of the present disclosure.

FIG. 17 illustrates another embodiment of a gate first method of the present disclosure that forms a semiconductor device on a germanium containing substrate, e.g., silicon germanium substrate. The term "germanium containing" denotes that the substrate includes at least 10 at. % germanium. For example, the germanium containing substrate may include be composed of germanium (Ge) or silicon germanium (Ge). A germanium substrate may be substantially 100 at. % germanium (Ge), e.g., greater than 95 at. % germanium (Ge). In some instances, a substantially 100 at. % germanium substrate may be 99.99 at. % germanium or greater. Examples of silicon germanium (SiGe) suitable for the germanium containing substrate include $Si_{0.25}Ge_{0.75}$, $Si_{0.5}Ge_{0.5}$, $Si_{0.75}Ge_{0.25}$ and combinations thereof.

SiGe channels are an alternative channel material to Si channel due to their comparatively higher electron and hole mobility, but it has been determined that the formation of high quality interfacial layer (IL) is challenging on substrates that are composed of silicon germanium (SiGe). It has been further determined that previous attempts at forming interfacial layers on SiGe substrates, such as high pressure oxidation (HPO), are insufficient in view of aggressive device scaling, because the growth $GeO_2$ using these prior methods is too thick and equivalent oxide thickness (EOT) scaling is hampered. "Equivalent oxide thickness (EOT)" is a distance, usually given in nanometers (nm), which indicates how thick a silicon oxide film would need to be to produce the same effect as the high-k material being used. Additionally, post plasma oxidation (PPO) is not suitable for 3-D structures, such as FinFETs or Nanowire FETs, due to directional nature of plasma process.

In some embodiments, the methods and structures disclosed herein can provide for EOT scaling with low gate leakage current/low-interface-state-density (Dit) on silicon germanium (SiGe) channels. In some examples, the channel of the semiconductor devices disclosed herein may include silicon germanium (SiGe) with varying germanium (Ge) percentage, e.g., germanium (Ge) percentage varying from 20% to 100%. In some examples, the method disclosed herein, e.g., as illustrated in FIG. 17, can provide an interfacial layer that includes germanium and oxygen in combination with silicon and nitrogen. The interfacial layer may be underling a high-k gate dielectric, such as hafnium aluminium oxide (HfAlO).

In some embodiments, the method for forming an interfacial layer on a silicon germanium channel region includes a process sequence in an atomic layer deposition (ALD) tool, which includes the steps of: (1) ALD $Al_2O_3$ (Al precursor+$H_2O$) (2) $O_3$ pulse, and (3) ALD $HfO_2$ (Hf precursor+$H_2O$). In some embodiments, the method may include an optional post high-k deposition nitridation treatment that could include a $NH_3$ thermal anneal, $N_2$ plasma or $NH_3$ plasma. The methods and gate structures can be implemented in a gate stack that can be applicable to both nFET and pFET devices, and is applicable to both planar and 3D structures, e.g. FinFET, and Nanowire FETs.

The methods and structures for forming an interfacial layer on a channel region composed of silicon germanium is now described in greater detail with reference to FIGS. 17-19.

FIG. 17 is a flow chart illustrating one embodiment of a gate first method for forming a semiconductor device on a germanium containing substrate. The method may begin with forming a metal oxide material on a SiGe semiconductor channel region at step 50a. The germanium channel region may be provided by a semiconductor substrate composed of germanium (Ge), single crystal germanium (Ge), polycrystalline germanium (Ge), silicon germanium (SiGe), silicon germanium doped with carbon (SiGe:C), and combinations thereof. In one example, the germanium channel region is provided by single crystalline silicon germanium (c-SiGe).

It is noted that step 50a is similar to step 50 of the method depicted in FIG. 1 with the exception that the substrate is composed of a germanium containing semiconductor, as opposed to a type III-V semiconductor material. Therefore, the above description of the metal oxide material 5, as depicted in FIG. 2, for the method described with reference to FIGS. 1-9 is suitable for describing the metal oxide material for the method illustrated by FIG. 17. For example, the metal oxide material 5 deposited on the germanium containing substrate may be composed of zirconium oxide ($ZrO_2$), aluminum oxide ($Al_2O_3$), lanthanum oxide ($La_2O_3$) or combinations thereof. Although atomic layer deposition (ALD) can be utilized to deposit the metal oxide material 5, the present disclosure is not limited to only this example, as the metal oxide material 5 may also be deposition on a germanium containing substrate using chemical vapor deposition (CVD). In one example, the metal oxide material 5 is an aluminum oxide ($Al_2O_3$) deposited to a thickness of 5 angstroms.

In some embodiments, when using atomic layer deposition (ALD), the metal oxide material 5 may be formed from a metal containing precursor and a water precursor. For example, when the metal oxide material is composed of aluminum oxide, the metal containing precursor may include aluminum (Al).

In a following process step 51a, the method may continue with treating the metal oxide material with an oxidation process. It is noted that step 51a is similar to step 51 of the method depicted in FIG. 1 with the exception that the substrate is composed of a germanium containing semiconductor, as opposed to a type III-V semiconductor material. Therefore, the above description of the oxidation process 6, as depicted in FIG. 2, for the method described with reference to FIGS. 1-9 is suitable for describing the metal oxide material for the method illustrated by FIG. 17. In some embodiments, the oxidation process may include an ozone (O3) treatment at a temperature ranging from 200° C. to 400° C. for a time period of 30 seconds to 90 seconds. In one example, the oxidation process includes ozone gas applied to the metal oxide material 5 at a temperature of 300° C. for a time period of 60 seconds.

In some embodiments, the ozone treatment may be applied to the metal oxide material 5 is the same deposition chamber that the metal oxide material 5 was formed in without an air break. It is noted that ozone ($O_3$) is only one example of a material that is suitable for the oxidation process. The oxidation process may also include $H_2O$ gas, NO, $N_2O$, atomic oxygen gas, air or a combination thereof or the oxidation process comprises a plasma comprising including at least one of $O_2$, $H_2O$, NO, $N_2O$ and combinations thereof. In other embodiments, the ozone treatment may be applied to the metal oxide material 5 after an air break.

In some embodiments, the in situ ozone ($O_3$) exposure at a temperature of 300° C., and a time period of 60 seconds produces a high quality oxide region 5a underlying the metal oxide material 5 at the interface of the metal oxide material, e.g., aluminum oxide ($Al_2O_3$) and the germanium containing substrate, e.g., silicon germanium (SiGe) substrate. For example, the oxide region 5a may be composed of germanium oxide ($GeO_2$). The thickness of the oxide region 5a may range from 1 Å to 5 Å, and in some instances may be equal to 2 Å. The oxide region 5a may be composed of 0% to 33% silicon, 33% to 0% germanium (Ge), 60% to 70% oxygen (O). The ratio of silicon and germanium is determined by the composition of the SiGe channel. In the case of Ge and SiGe with Ge fraction greater than 85%, the oxide region 5a predominantly consists from $GeO_2$. As will described further below, an optional nitridation treatment may be further applied to the structure, which could incorporate nitrogen into the oxide region 5a that may range from 1% to 30% in concentration, substituting oxygen atoms. In some embodiments, the oxide region 5a, which may also be referred to as an interfacial layer (IL), may be (Si)GeO(N).

Figure 18:
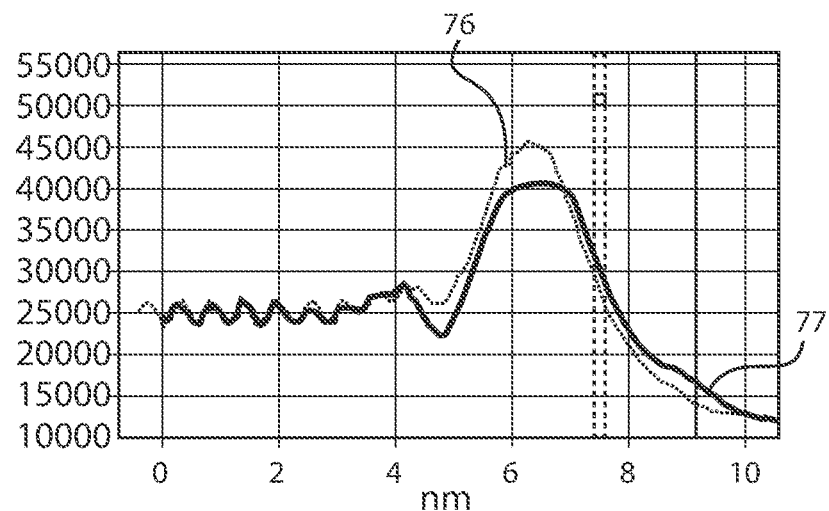
FIG. 18 is a plot of Z-contrast scanning transmission electron microscope (Z-contrast STEM) measurements of an oxide region formed in accordance with method illustrated in FIG. 17.

FIG. 18 depicts one embodiment of a plot of Z-contrast scanning transmission electron microscope (Z-contrast STEM) of an oxide region 5a produced by a process sequence that included depositing an aluminum oxide layer having a thickness of 5 Å on a crystalline silicon germanium substrate by ALD, an ozone ($O_3$) treatment for 60 seconds and a hafnium oxide layer being deposited after the ozone treatment having a thickness of 20 Å. This data is plotted by reference line 77. The plot identified by reference line 76 is a similarly prepared structure but does not include the ozone treatment. Comparison of the plot identified by reference number 76 to the plot line identified by reference line 77 indicates the presence of an oxide region 5a having a thickness of 2 Å.

Figure 19:
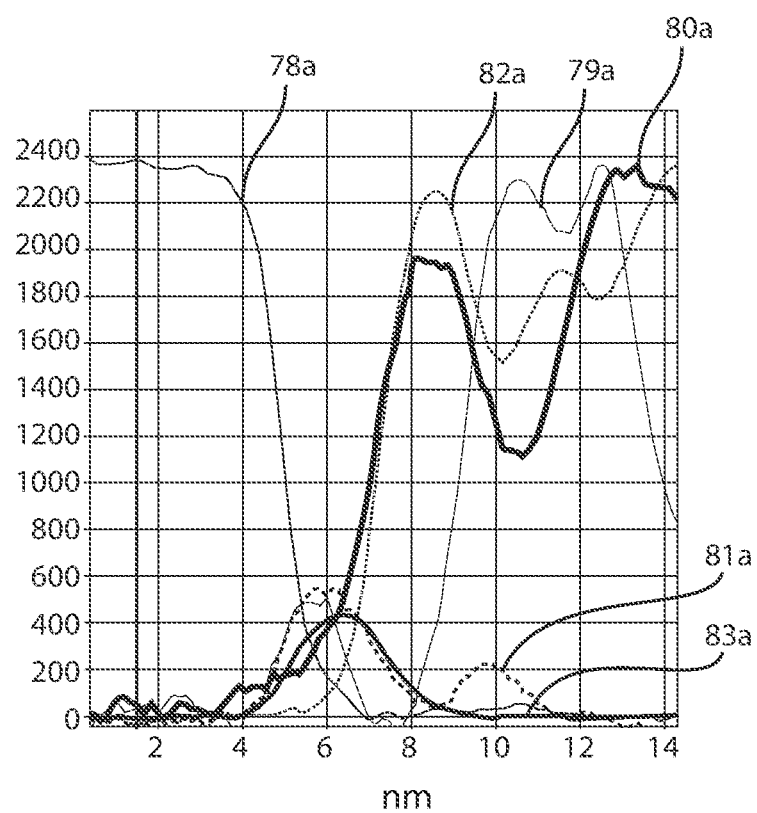
FIG. 19 is an electron energy loss spectroscopy (EELS) plot of the composition of an oxide region that is formed using the method described with reference to FIG. 17.
Figure 20:
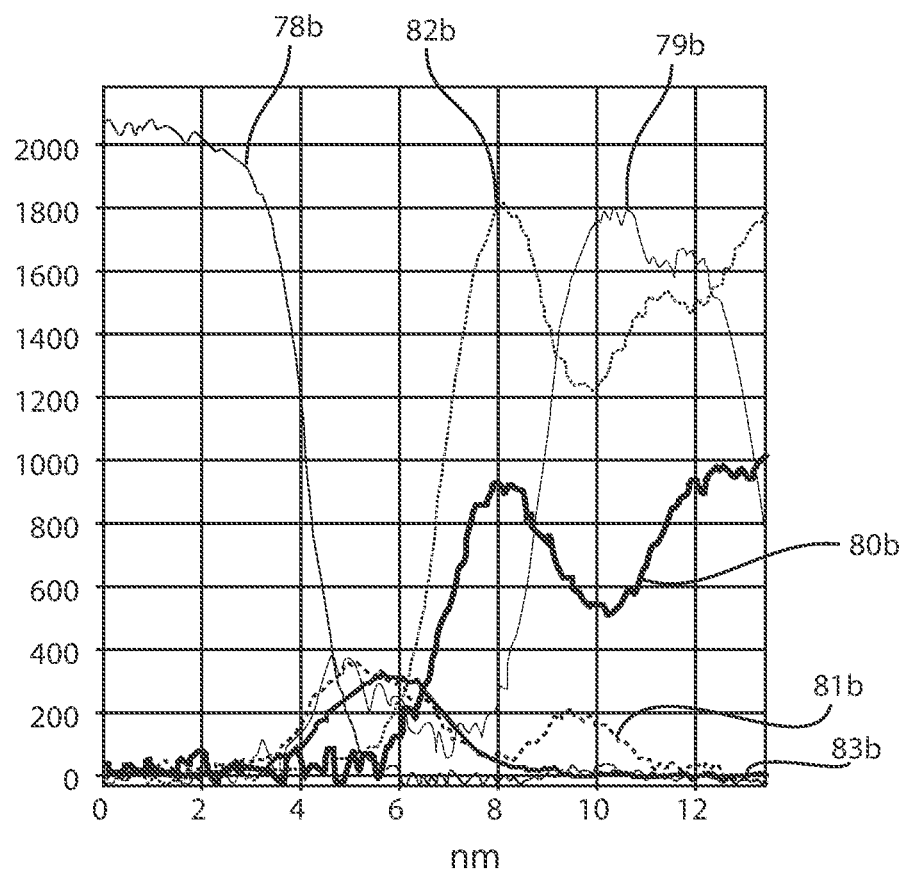
FIG. 20 an electron energy loss spectroscopy (EELS) plot of a comparative composition of an oxide region that is not formed using a process sequence using an oxidation step.

FIG. 19 is an electron energy loss spectroscopy (EELS) plot of the composition of an oxide region 5a that is formed using the method described with reference to FIG. 17. The plot identified by reference number 78a is for germanium (Ge), the plot identified by reference number 79a is for aluminum (Al), the plot identified by reference number 80a is for nitrogen, the plot identified by reference number 81a is for oxygen, the plot identified by reference number 82a is for titanium, and the plot identified by reference number 83a is for hafnium. FIG. 20 is an electron energy loss spectroscopy (EELS) plot of a comparative composition of an oxide region 5a that is formed using a method similar to the method described with reference to FIG. 17, but the method for forming the comparative composition does not include an oxidation step. The plot identified by reference number 78b is for germanium (Ge), the plot identified by reference number 79b is for aluminum (Al), the plot identified by reference number 80b is for nitrogen, the plot identified by reference number 81b is for oxygen, the plot identified by reference number 82b is for titanium, and the plot identified by reference number 83b is for hafnium. Comparison of the plots depicted in FIGS. 19 and 20 illustrate intermixing of hafnium and aluminum within the oxide region 5a formed using the method described with reference to FIG. 17.

Referring to FIG. 17, the method may continue with forming a hafnium containing oxide 15 on the metal oxide material 5 after the oxidation process at step 52a. It is noted that step 52a is similar to step 52 of the method depicted in FIG. 1 with the exception that the substrate is composed of a germanium containing semiconductor material, as opposed to a type III-V semiconductor material. Therefore, the above description of the hafnium containing oxide, as depicted in FIG. 2, for the method described with reference to FIGS. 1-9 is suitable for describing the hafnium containing oxide 15 for the method illustrated by FIG. 17. For example, the hafnium containing oxide 15 may be hafnium oxide ($HfO_2$), which may be deposited after the oxidation process 6 by atomic layer deposition with, or without, an air break between the oxidation process 6 and the formation of the hafnium containing oxide 15. In one embodiment, the process flow to this stage of the method may include depositing an aluminum oxide layer ($Al_2O_3$), i.e., metal oxide material with a thickness of 5 Å; treatment with an oxidation process including ozone gas for 60 seconds, and depositing a hafnium oxide layer having a thickness of 10 Å, wherein the process is conducted in the deposition chamber of an atomic layer deposition (ALD) apparatus without an air break.

Referring to FIG. 17, the method may continue with forming a gate conductor atop the hafnium containing oxide at step 53a. It is noted that step 53a is similar to step 53 of the method depicted in FIG. 1 with the exception that the substrate is composed of a germanium containing semiconductor, as opposed to a type III-V semiconductor material. Therefore, the above description of the gate conductor 20, as depicted in FIG. 2, for the method described with reference to FIGS. 1-9 is suitable for describing the gate conductor for the method illustrated by FIG. 17.

At step 54a of the process flow depicted in FIG. 17, the method may continue with patterning the gate conductor, hafnium containing oxide and the metal oxide material that was oxidized. This sequence of steps has been described above with reference to step 54 of the method described with reference to FIGS. 1-9. Referring to FIG. 17, the method may continue with forming source and drain regions at step 55a. The source and drain regions may be formed by ion implanting n-type or p-type dopants into the germanium containing substrate on opposing sides of the channel. Because, germanium containing materials, such as silicon germanium, are type IV semiconductors, examples of n-type dopants, i.e., impurities, include but are not limited to, antimony, arsenic and phosphorous. Because, germanium containing materials, such as silicon germanium, are type IV semiconductors, an example of a p-type dopants, i.e., impurities, includes, but is not limited to boron.

Figure 21:
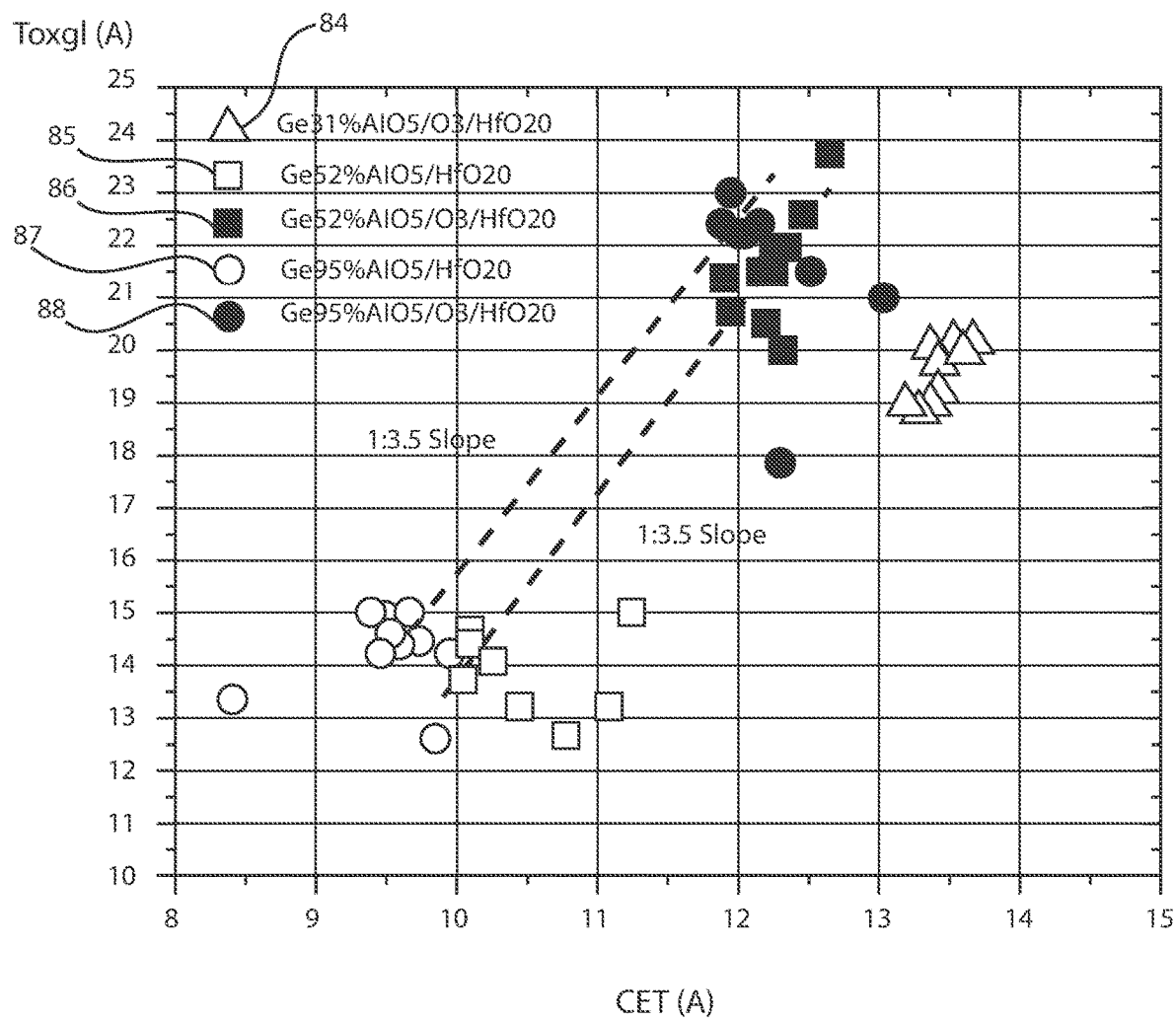
FIG. 21 is a plot illustrating the electrical impact of the oxidation treatment applied to a bilayer of aluminum oxide and hafnium oxide, in accordance with one embodiment of the present disclosure.

FIG. 21 is a plot illustrating the electrical impact of the oxidation treatment applied to a bilayer of aluminum oxide and hafnium oxide that is formed on a germanium containing substrate, in accordance with the method described with reference to FIG. 17. The gate structures providing the electrical performance depicted in FIG. 18 included a metal oxide material provided by aluminum oxide ($Al_2O_3$), and a hafnium containing dielectric provided by hafnium oxide ($HfO_2$). The plot identified by reference number 84 was from a gate stack including a 5 Å aluminum oxide layer ($Al_2O_3$) present on a substrate composed of 31% germanium (Ge), which was treated with an ozone ($O_3$) gas treatment, and a hafnium oxide ($HfO_2$) layer having a thickness of 20 Å that is present on the aluminum oxide layer. The plot identified by reference number 85 was from a gate stack including a 5 Å aluminum oxide layer ($Al_2O_3$) present on a substrate composed of 52% germanium (Ge), which was not treated with an ozone ($O_3$) gas treatment, and a hafnium oxide ($HfO_2$) layer having a thickness of 20 Å that is present on the aluminum oxide layer. The plot identified by reference number 86 was from a gate stack including a 5 Å aluminum oxide layer ($Al_2O_3$) present on a substrate composed of 52% germanium (Ge), which was treated with an ozone ($O_3$) gas treatment, and a hafnium oxide ($HfO_2$) layer having a thickness of 20 Å that is present on the aluminum oxide layer. The plot identified by reference number 87 was from a gate stack including a 5 Å aluminum oxide layer (Al$_2$O$_3$) present on a substrate composed of 95% germanium (Ge), which was not treated with an ozone (O$_3$) gas treatment, and a hafnium oxide (HfO$_2$) layer having a thickness of 20 Å that is present on the aluminum oxide layer. The plot identified by reference number 88 was from a gate stack including a 5 Å aluminum oxide layer (Al$_2$O$_3$) present on a substrate composed of 95% germanium (Ge), which was treated with an ozone (O$_3$) gas treatment, and a hafnium oxide (HfO$_2$) layer having a thickness of 20 Å that is present on the aluminum oxide layer.

FIG. 21 illustrates an increase of Toxgl by 7 Å, which is equivalent to 1000× gate leakage current density (J$_g$), with much smaller increase in CET and 2X interface state density (D$_{it}$) reduction for a material stack including the oxidation process as described with reference to FIG. 17, in comparison to a similar material stack that was not treated with the oxidation process described in FIG. 17.

Figure 22:
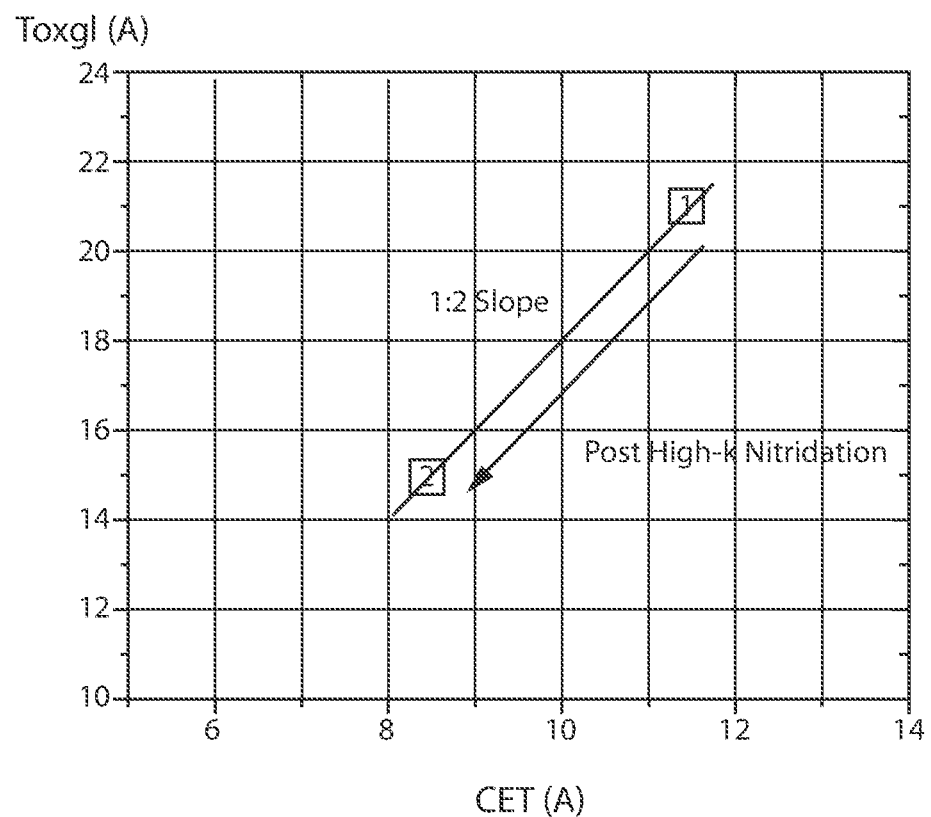
FIG. 22 is a plot illustrating the electrical impact of the optional nitridation treatment applied to a bilayer of aluminum oxide and hafnium oxide, in accordance with one embodiment of the present disclosure.

In some embodiments, the method depicted in FIG. 17 may include an optional nitridation step that is applied after the formation of the hafnium containing oxide. For example, the nitridation step may include a thermal anneal in a nitrogen containing gas atmosphere, e.g., NH$_3$ thermal anneal. The anneal temperature may range from 600° C. to 700° C. In another example, the nitridation step may include a plasma treatment, in which the plasma may include N$_2$ and/or NH$_3$ plasma. The nitridation process may incorporate nitrogen (N) into the oxide region 5a, which may also be referred to as an interfacial layer (IL). The incorporation of nitrogen into the oxide region produced using the process sequence illustrated by FIG. 17 may provide further capacitance equivalent thickness (CET) scaling, as depicted in FIG. 22. FIG. 22 is a plot illustrating the electrical impact of the optional nitridation treatment applied to a bilayer of aluminum oxide and hafnium oxide.

Figure 23:
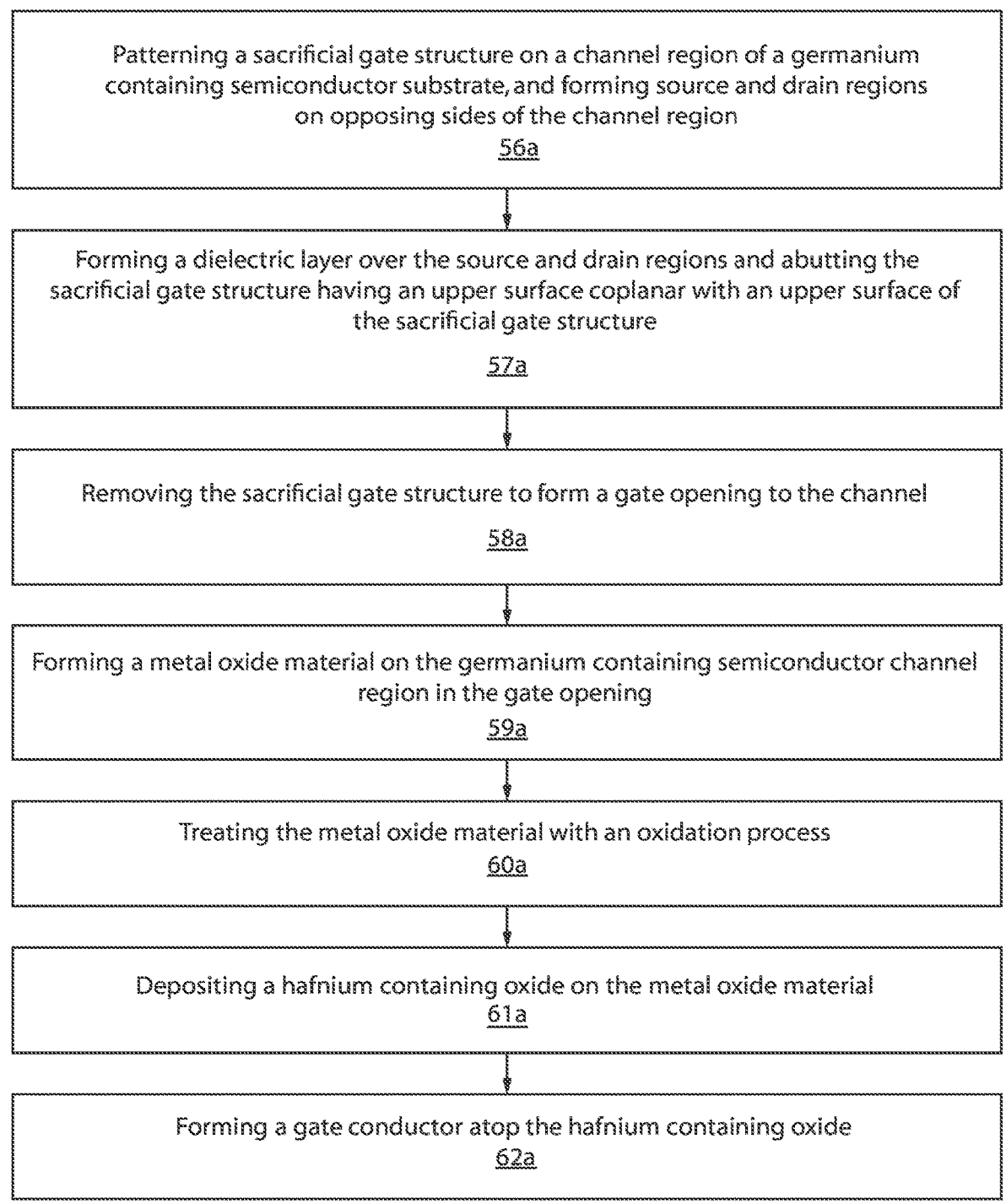
FIG. 23 is a flow chart illustrating one embodiment of a gate last method for forming a semiconductor device on a germanium containing semiconductor substrate, in accordance with one embodiment of the present disclosure.

The process flow described in FIG. 17 is a gate first process flow. The present disclosure is not limited to only this process flow, as the oxidation step described in FIG. 17 is equally applicable to a gate last process flow. FIG. 23 is a flow chart illustrating one embodiment of a gate last method for forming a semiconductor device on a germanium containing semiconductor substrate, in accordance with one embodiment of the present disclosure.

Referring to FIG. 23, the method may begin with forming a sacrificial gate structure on a germanium containing substrate, and forming source and drain regions on opposing sides of a channel region of a semiconductor device, at step 56a. It is noted that step 56a is similar to step 56 of the method depicted in FIG. 10 with the exception that the substrate is composed of a germanium containing semiconductor, as opposed to a type III-V semiconductor material, and the source and drain regions are composed of dopants for type IV semiconductors. Therefore, the above description of forming a sacrificial gate structure 35 and source and drain regions 25, 30, as depicted in FIG. 11, for the method described with reference to FIGS. 10-16 is suitable for describing the formation of the sacrificial gate structure 35 and source and drain regions 25, 30 for the method illustrated by FIG. 23. The n-type and p-type dopants for the source and drain regions being formed in the germanium containing substrate 1 have been described with reference to FIG. 17.

Referring to FIG. 23, the method may continue with step 57a, which includes forming a dielectric layer overlying the source and drain regions and having an upper surface coplanar with the upper surface of the sacrificial gate structure. Step 56a is similar to step 56 of the method depicted in FIG. 10 with the exception that the substrate is composed of a germanium containing semiconductor, as opposed to a type III-V semiconductor material. Therefore, the above description of the interlevel dielectric 36, as depicted in FIG. 11, for the method described with reference to FIGS. 10-16 is suitable for describing the formation of the dielectric layer for the method illustrated by FIG. 23.

Step 58a of the method sequence in FIG. 23 includes removing the sacrificial gate structure to form a gate opening to the channel. Removing the sacrificial gate structure has been described above in step 58 of FIG. 10, as depicted in FIG. 12.

Referring to FIG. 23, in a following step, a metal oxide material is formed in the gate opening at step 59a. Step 59a is similar to step 59 of the method depicted in FIG. 10 with the exception that the substrate is composed of a germanium containing semiconductor, as opposed to a type III-V semiconductor material. Therefore, the above description of the metal oxide material 5, as depicted in FIG. 13, for the method described with reference to FIGS. 10-16 is suitable for describing the formation of the metal oxide material for the method illustrated by FIG. 23.

The method illustrated in FIG. 23 may continue with step 60a, which includes treating the metal oxide material with an oxidation process. Step 60a is similar to step 60 of the method depicted in FIG. 10 with the exception that the substrate is composed of a germanium containing semiconductor, as opposed to a type III-V semiconductor material. Therefore, the above description of the oxidation process 6, as depicted in FIG. 14, for the method described with reference to FIGS. 10-16 is suitable for describing the oxidation process for the method illustrated by FIG. 23. Further details of the oxidation process specific to forming devices on germanium containing substrates may also be found above referring to step 51a of the process flow illustrated in FIG. 17.

The oxidation process of step 51a forms an oxide region, e.g., germanium containing oxide, underlying the metal oxide material at an interface with the metal oxide material and the germanium containing substrate. Further details regarding the oxide region are provided above with reference to step 51a of FIG. 17. The impact of the oxidation process, e.g., electrical impact, is described above with reference to FIGS. 18-21.

Referring to FIG. 23, the method may continue with step 61a, which includes treating forming the hafnium containing oxide on the metal oxide material. Step 61a is similar to step 61 of the method depicted in FIG. 10 with the exception that the substrate is composed of a germanium containing semiconductor, as opposed to a type III-V semiconductor material. Therefore, the above description of the hafnium containing oxide 15, as depicted in FIG. 15, for the method described with reference to FIGS. 10-16 is suitable for describing the hafnium containing oxide for the method illustrated by FIG. 23. Further details of the hafnium containing oxide specific to forming devices on germanium containing substrates may also be found above referring to step 52a of the process flow illustrated in FIG. 17.

Referring to FIG. 23, in a following process, a gate conductor is formed atop the hafnium containing oxide at step 62a. Step 62a is similar to step 62 of the method depicted in FIG. 10 with the exception that the substrate is composed of a germanium containing semiconductor, as opposed to a type III-V semiconductor material. Therefore, the above description of the gate conductor 20, as depicted in FIG. 16, for the method described with reference to FIGS. 10-16 is suitable for describing the gate conductor for the method illustrated by FIG. 23. Further details for the gate conductor 20 specific to forming devices on germanium containing substrates may also be found above referring to step 53a of the process flow illustrated in FIG. 17.

It is noted that the process sequence illustrated in FIG. 23 may further include an optional nitridation step that is conducted after forming the hafnium containing oxide. The optional nitridation step is described above with reference to FIG. 17 and FIG. 22.

Figure 24A:
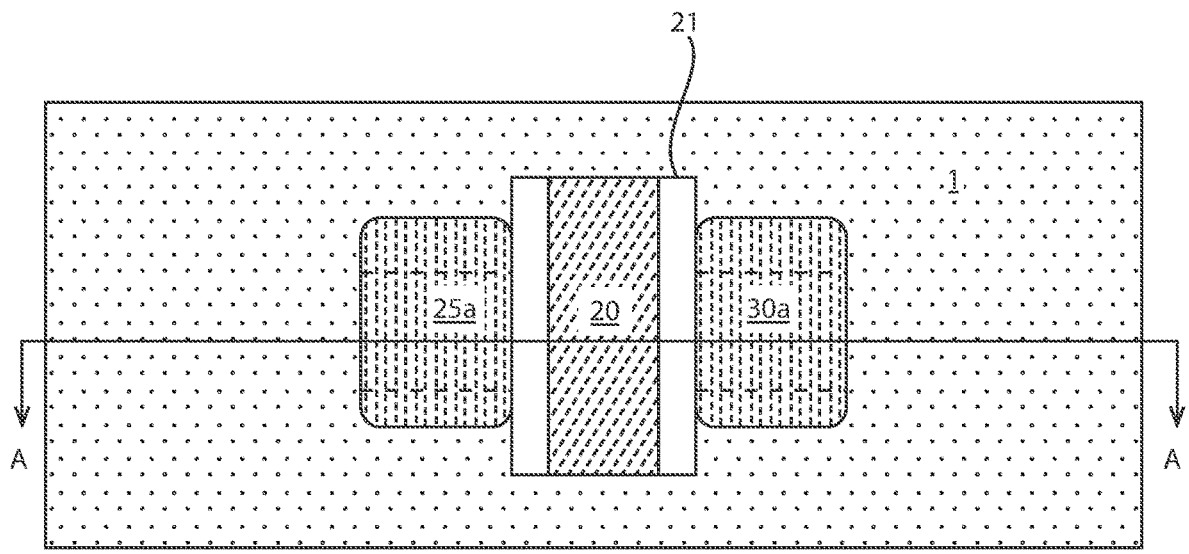
FIG. 24A is a top down view of a fin field effect transistor having a gate structure formed in accordance with the present disclosure.
Figure 24B:
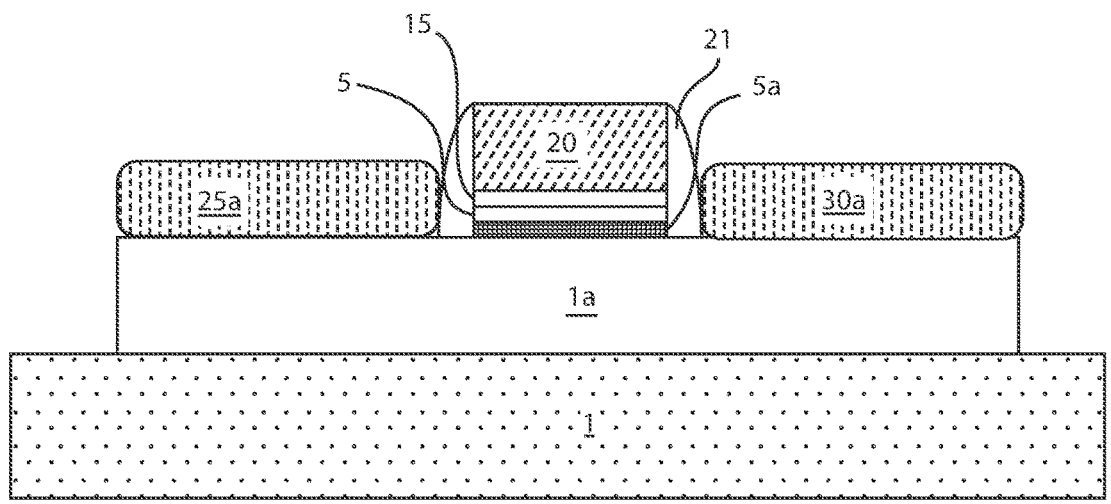
FIG. 24B is a side cross-sectional view along section line A-A of FIG. 24A.

Although the structures depicted in the supplied drawings are planar devices, the present disclosure is not limited to only this example. For example, the methods disclosed herein may be suitable for forming gate structures to FinFET devices, as depicted in FIGS. 24a and 24b. FinFET devices are field effect transistors in which the channel is present in a fin structure 1a. As used herein, a "fin structure" refers to a semiconductor material, which is employed as the body of a semiconductor device, in which the gate structure is positioned around the fin structure such that charge flows down the channel on the two sidewalls of the fin structure 1a and optionally along the top surface of the fin structure 1a. In some embodiments, a fin structure may have a height ranging from 5 nm to 200 nm. In another embodiment, the fin structure may have a height ranging from 10 nm to 100 nm. In some embodiments, the fin structures may have a width of less than 20 nm. In another embodiment, each of the fin structures has a width ranging from 3 nm to 8 nm. The methods described with reference to FIGS. 1 and 10 may employ a fin structure 1a that is composed of a type III-V semiconductor material. The methods described with reference to FIGS. 17 and 23 may employ a fin structure 1a that is composed of a germanium containing material. The fin structure 1a may be present atop a supporting substrate 1b, which may be a dielectric material. The metal oxide material 5, oxide region 5a, the hafnium containing oxide layer 15, the gate conductor 20 and the source and drain regions 25, 30 that are depicted in FIGS. 24a and 24b have been described above with reference to FIGS. 1-23.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming a semiconductor device comprising:
   forming a metal oxide material on a III-V semiconductor channel region;
   treating an exposed surface of the metal oxide material with a plasma oxidation process, wherein the plasma oxidation process is conducted at a temperature in a range of about 20° C. to about 500° C., and wherein an element from the III-V semiconductor channel region characterized within group III or group V of the periodic table of elements diffuses into the metal oxide material to provide an oxide alloyed region between the metal oxide material and the III-V semiconductor channel region, the element from the III-V semiconductor channel region having its highest concentration in the oxide alloyed region at an interface between the metal oxide material and the oxide alloyed region;
   depositing a hafnium containing oxide directly on the metal oxide material after the plasma oxidation process; and
   forming a gate conductor atop the hafnium containing oxide, wherein source and drain regions are present on opposing sides of a gate structure including the metal oxide material, the hafnium containing oxide, and the gate conductor.

2. The method of claim 1, wherein the III-V semiconductor channel region comprises a semiconductor material selected from the group consisting of gallium arsenide (GaAs), indium gallium arsenide (InGaAs), indium arsenide (InAs), indium phosphide (InP), gallium antimonide (GaSb), indium antimonide (InSb), indium gallium antimonide (InGaSb), and combinations thereof.

3. The method of claim 2, wherein the metal oxide material comprises an oxide selected from the group consisting of zirconium oxide ($ZrO_2$), aluminum oxide ($Al_2O_3$), lanthanum oxide ($La_2O_3$) and combinations thereof.

4. The method of claim 1, wherein the hafnium containing oxide comprises hafnium oxide ($HfO_2$).

5. The method of claim 1, wherein the metal oxide material is deposited using chemical vapor deposition (CVD) or atomic layer deposition (ALD).

6. The method of claim 1, wherein the treating of the metal oxide material with the plasma oxidation process is conducted in a same deposition chamber that deposits said metal oxide layer, without an air break.

7. The method of claim 6, wherein the plasma oxidation process comprises a plasma including plasma gas species selected from the group consisting of $O_2$, $H_2O$, NO, $N_2O$ and combinations thereof.

8. The method of claim 6, wherein the plasma oxidation process comprises a different oxygen containing precursor than a deposition process for depositing said metal oxide material, wherein an exposure precursor time during said oxidation process is greater than an exposure precursor time during said depositing said metal oxide material.

9. The method of claim 1, wherein said gate structure is formed using a gate first or a gate last process flow.

10. The method of claim 1, wherein the hafnium containing oxide is deposited using chemical vapor deposition (CVD) or atomic layer deposition (ALD), wherein said depositing of the hafnium containing oxide is conducted in a same deposition chamber that applies said plasma oxidation process, and deposits said metal oxide material without an air break.

* * * * *